(12) United States Patent
Naeimi et al.

(10) Patent No.: US 10,552,257 B2
(45) Date of Patent: Feb. 4, 2020

(54) ADAPTIVE ERROR CORRECTION IN MEMORY DEVICES

(71) Applicant: Intel Corporation, Santa Clara, CA (US)

(72) Inventors: Helia Naeimi, Santa Clara, CA (US); Wei Wu, Portland, OR (US); Shigeki Tomishima, Portland, OR (US); Shih-Lien Lu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 105 days.

(21) Appl. No.: 15/737,202

(22) PCT Filed: Jun. 2, 2016

(86) PCT No.: PCT/US2016/035513
§ 371 (c)(1),
(2) Date: Dec. 15, 2017

(87) PCT Pub. No.: WO2016/209586
PCT Pub. Date: Dec. 29, 2016

(65) Prior Publication Data
US 2018/0165152 A1    Jun. 14, 2018

Related U.S. Application Data

(63) Continuation of application No. 14/748,826, filed on Jun. 24, 2015, now abandoned.

(51) Int. Cl.
*G11C 29/00* (2006.01)
*G06F 11/10* (2006.01)
(Continued)

(52) U.S. Cl.
CPC ...... *G06F 11/1048* (2013.01); *G11C 11/1673* (2013.01); *G11C 11/1675* (2013.01); *G11C 29/52* (2013.01); *G11C 2029/0411* (2013.01)

(58) Field of Classification Search
CPC . G11C 29/52; G11C 11/1675; G11C 11/1673; G11C 2029/0411;
(Continued)

(56) References Cited

U.S. PATENT DOCUMENTS 8,312,349 B2    11/2012    Reche et al.
8,453,034 B2    5/2013     Sakaue
(Continued)

FOREIGN PATENT DOCUMENTS

CN    107683464    2/2018
WO    WO-2016209586 A1    12/2016

OTHER PUBLICATIONS

"U.S. Appl. No. 14/748,826, Final Office Action dated May 25, 2017", 5 pgs.
(Continued)

*Primary Examiner* — Guerrier Merant
(74) *Attorney, Agent, or Firm* — Schwegman Lundberg & Woessner, P.A.

(57) ABSTRACT

Some embodiments include apparatuses and methods having an interface to receive information from memory cells, the memory cells configured to have a plurality of states to indicate values of information stored in the memory cells, and a control unit to monitor errors in information retrieved from the memory cells. Based on the errors in the information, the control unit generates control information to cause the memory cell to change to from a state among the plurality of states to an additional state. The additional state is different from the plurality of states.

22 Claims, 17 Drawing Sheets

(51) Int. Cl.
*G11C 29/52* (2006.01)
*G11C 11/16* (2006.01)
*G11C 29/04* (2006.01)

(58) Field of Classification Search
CPC ... G11C 11/5621; G11C 16/349; G11C 11/56; G11C 29/00; G11C 29/08; G11C 29/10; G11C 2029/0401; G11C 2029/0409; G06F 11/1048; G06F 11/10; G06F 11/1658; G06F 2201/82; G06F 11/1068; G06F 11/167
See application file for complete search history.

(56) References Cited

U.S. PATENT DOCUMENTS

| | | | |
|---|---|---|---|
| 8,607,121 B2 | 12/2013 | Moyer | |
| 8,621,318 B1 | 12/2013 | Micheloni et al. | |
| 8,923,044 B2 | 12/2014 | Li et al. | |
| 2005/0120265 A1* | 6/2005 | Pline | G06F 11/1008 714/6.32 |
| 2005/0283566 A1* | 12/2005 | Callaghan | G06F 12/1408 711/104 |
| 2009/0037782 A1* | 2/2009 | Hughes | G11C 29/02 714/53 |
| 2011/0161784 A1* | 6/2011 | Selinger | G06F 11/1068 714/768 |
| 2012/0173920 A1* | 7/2012 | Park | G11C 16/349 714/6.11 |
| 2013/0058154 A1* | 3/2013 | Katagiri | G11C 8/10 365/148 |
| 2013/0135951 A1* | 5/2013 | Ho | G11C 29/44 365/200 |
| 2013/0238955 A1* | 9/2013 | D'Abreu | G06F 11/1048 714/763 |
| 2014/0068360 A1* | 3/2014 | Lai | G11C 29/08 714/718 |
| 2015/0213885 A1* | 7/2015 | Katoh | G11C 13/0007 365/148 |
| 2015/0255176 A1* | 9/2015 | Hyder | G11C 29/4401 714/723 |
| 2016/0164543 A1* | 6/2016 | Kumar | H03M 13/2909 714/755 |
| 2016/0301429 A1* | 10/2016 | Shany | H03M 13/1515 |
| 2016/0378591 A1 | 12/2016 | Naeimi et al. | |

OTHER PUBLICATIONS

"U.S. Appl. No. 14/748,826, Non Final Office Action dated Nov. 30, 2016", 18 pgs.
"U.S. Appl. No. 14/748,826, Response filed Mar. 30, 2017 to Non Final Office Action dated Nov. 30, 2016", 18 pgs.
"International Application Serial No. PCT/US2016/035513, International Search Report dated Sep. 7, 2016", 3 pgs.
"International Application Serial No. PCT/US2016/035513, Written Opinion dated Sep. 7, 2016", 11 pgs.
U.S. Appl. No. 14/748,826, filed Jun. 24, 2015, Adaptive Error Correction in Memory Devices.

* cited by examiner

STATE X

STATE 0

STATE 1

ADAPTIVE ERROR CORRECTION IN MEMORY DEVICES

CLAIM OF PRIORITY

This application is a U.S. National Stage Filing under 35 U.S.C. 371 from International Application No. PCT/US2016/035513, filed on Jun. 2, 2016, and published as WO 2016/209586 on Dec. 29, 2016, which claims the benefit of priority to U.S. patent application Ser. No. 14/748,826 filed Jun. 24, 2015, now published as US-2016-0378591-A1, the entire contents of which are hereby incorporated by reference herein in their entirety.

TECHNICAL FIELD

Embodiments described herein pertain to memory in electronic systems. Some embodiments relate to error detection and correction in memory devices.

BACKGROUND

Many electronic devices or systems, such as computers, tablets, and cellular phones, have memory to store information (e.g., data). The information can be stored in memory cells of the memory. Some conventional memory may employ techniques (e.g., error detection and correction techniques) to deal with errors that might occur in information retrieved from the memory cells. Factors associated with such techniques may involve overhead, power consumption, and yield. In some memory, dealing with such factors may pose a challenge.

DETAILED DESCRIPTION

Figure 1:
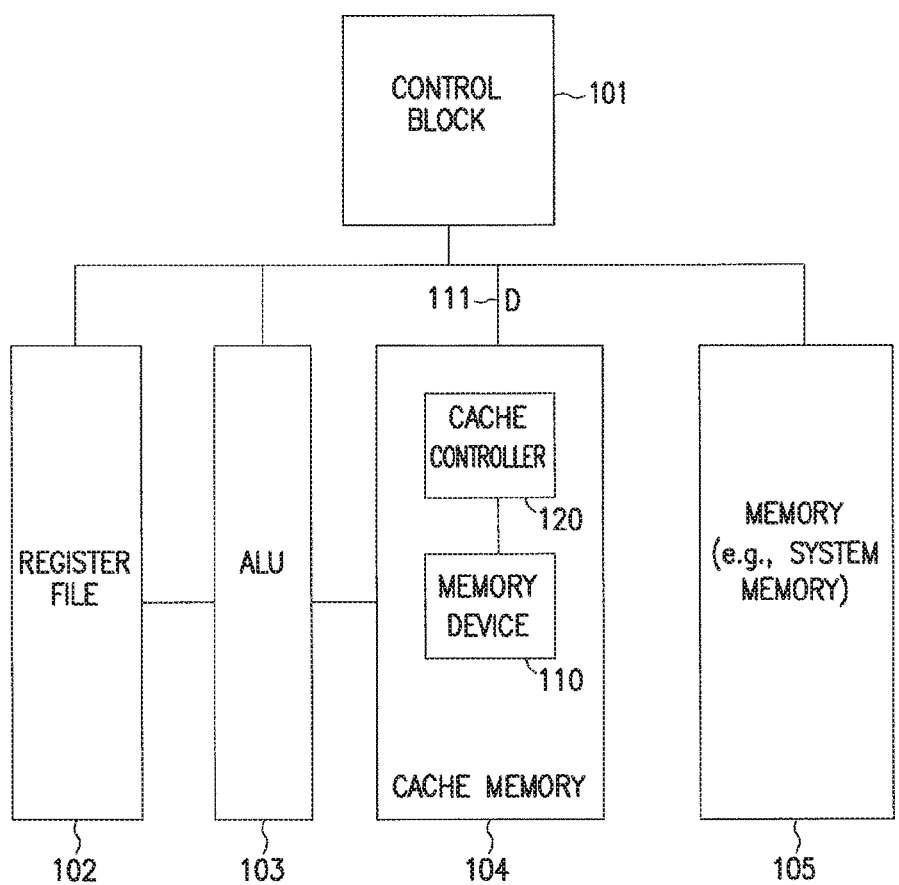
FIG. 1 shows a block diagram of an apparatus in the form of a processor, according to some embodiments described herein.

FIG. 1 shows a block diagram of an apparatus in the form of a processor 100, according to some embodiments described herein. Processor 100 can include a general-purpose processor or an application-specific integrated circuit (ASIC). Processor 100 can be part of (e.g., included in) an electronic device or system, such as a computer (e.g., desktop or notebook computer), a tablet, a cellular telephone, and other electronic devices or systems.

As shown in FIG. 1, processor 100 can include a control block 101, a register file 102, an arithmetic logic unit (ALU) 103, a cache memory 104, and a memory (e.g., main memory) 105. One skilled in the art would recognize that a processor (e.g., a central processing unit (CPU)) such as processor 100 includes many additional components, several of which are not shown in FIG. 1 so as not to obscure the embodiments described herein.

Processor 100 can be included in a chip (e.g., a semiconductor die). Thus, in the arrangement shown in FIG. 1, control block 101, register file 102, ALU 103, cache memory 104, and memory 105 can be located on (e.g., formed on or formed in) the same chip (e.g., the same semiconductor die). In an alternative arrangement, memory 105 can be omitted from processor 100. In such an alternative arrangement, memory 105 can be located in another chip (or in multiple chips) separated from the chip that includes processor 100.

Control block 101 can be arranged (e.g., configured) to control operations of processor 100. For example, control block 101 may include logic circuitry (e.g., control logic and instruction decoders) and other components to control operations of processor 100. Control block 101 can be part of (e.g., included in) a processing core (e.g., processor core of a CPU) of processor 100.

Register file 102 can include volatile memory cells (or alternatively non-volatile memory cells) that can be arranged to store information (e.g., data, instruction codes, and other information). Examples of volatile memory cells include static random access memory (SRAM) cells. ALU 103 can perform arithmetic logic functions in processor 100. Memory 105 can include volatile memory cells, non-volatile memory cells, or a combination of both. Examples of volatile memory cells include dynamic random access memory (DRAM) cells and SRAM cells. Examples of non-volatile memory cells include flash memory cells or other types of non-volatile memory cells.

Cache memory 104 can include a memory device 110 and a cache controller 120. Cache memory 104 can receive data from or provide data to other components of processor 100. Data D on path 111 can represent data (e.g., input data) received by cache memory 104 (e.g., during a write operation) or data (e.g., output data) provided by cache memory 104 (e.g., during a read operation). Path 111 can include a bus or part of a bus (e.g., conductive lines on a semiconductor die) coupled between cache memory 104 and at least one of the other components (e.g., control block 101) of processor 100.

During a write operation, cache controller 120 may receive data D (e.g., provided to it by control block 101) to be stored in memory device 110. Data D can include user data or other types of data used in processor 100. Before storing data D in memory device 110, cache controller 120 may perform an encode operation to encode data D with error correction code (ECC). After the encode operation, cache controller 120 may provide both data D and ECC to memory device 110 to be stored (e.g., during a write operation) in memory cells (not shown) of memory device 110. The ECC may allow cache controller 120 to correct errors that may occur in information when the information is retrieved (e.g., read) from memory device 110 during a read operation.

Cache controller 120 can perform a decoding operation on information (e.g., data and its associated ECC) retrieved from memory cells of memory device 110. The decoding operation can detect errors that may occur in the retrieved information. Cache controller 120 may correct any errors in the information and provide data D to other components (e.g., to control block 101) of processor 100.

Memory device 110 may include a type of memory device (e.g., SIT type) that may have a relatively high failure (e.g., retention failure) rate at certain scaled dimensions. To address failure such as retention failure, cache lines in memory device 110 can be protected with ECC, and memory device 110 may be frequently scrubbed to prevent error accumulation. In memory device 110, only a relatively small portion of memory cells in the array of memory cells may have retention failure (e.g., have a low retention time). However, identifying such memory cells may be difficult in some cases. Hence, in order to achieve a relatively higher yield, the scrub rate for the array in memory device 110 may be determined by the memory cell with the lowest retention time. Moreover, selecting a right ECC to fit the retention time of the array may pose a challenge. Thus, selecting the ECC may still be a pessimistic approach because the ECC may need to ensure that there are not too many cells with a lower retention time than the scrub rate in each cache line. The techniques described herein may address these issues.

To prevent the pessimistic design for the worst-case approach, the techniques described herein include an adaptive ECC technique. The scrub rate of memory cells in the techniques described herein may start with a relatively high scrub rate. Then, as memory device 110 goes through normal operations (e.g., normal write and read operations), some memory cells in memory device 110 may be determined to be defective. Memory cells determined to be defective can be placed in a particular state that is different e.g., distinguishable) from states (e.g., normal state) that normal memory cells have. After particular memory cells determined to be defective are placed in such a particular state, the particular memory cells may be considered as a "burned" memory cells. Burned memory cells, however, may still be used to store information as if they were normal (non-defective) memory cells. Information stored in the burned memory cells are viewed as "burned" bits in the ECC (e.g., ECC codeword). As the number of burned memory cells increases, the number of burned bits covered by the ECC increases and the number of bits having errors (e.g., random errors) decreases. The ECC can correct up to twice as much burned bits as bits having random errors. Hence, every time memory cells are determined to be defective and considered as burned bits, the retention time guardband can be adjusted (e.g., relaxed) because errors covered by the ECC increases. Adjusting the guardband on the scrub rate may improve system performance and power.

Cache controller 120 can also monitor errors in information retrieved from memory device 110 in order to perform the adaptive ECC technique mentioned above. Cache controller 120 may generate control information based on the monitoring of errors in the information (described in more detail below). The control information can include information (e.g., physical address) of a memory cell (or multiple memory cells) determined to be defective (e.g., bad memory cell) by cache controller 120. Changing the state of a memory cell that has been determined to be defective is performed by memory device 1110. For example, after generating the control information, cache controller 120 may send it to memory device 110. Based on the control information, memory device 110 can cause (e.g., perform a special write operation on) a memory cell (or memory cells) determined to be defective to have a particular state different (e.g., distinguishable) from states (e.g., normal states) of normal memory cells (e.g., non-defective memory cells) of memory device 110.

Memory cells of memory device 110 can be configured to have states (e.g., normal states) to indicate values (e.g., binary 0 and binary 1) of information stored in the memory cells. A particular state placed in a memory cell determined to be defective is different from the normal states used to indicate information stored in the memory cells. The particular state is not configured to indicate the value of information stored memory cells of memory device 110. For example, the particular state may include an irreversible state. The irreversible state may not be changed back to a state that is used to indicate the value (e.g., binary 0 or 1) of information stored in a memory cell. As mentioned above, after a memory cell determined to be defective is placed in a particular state, that memory cell can be considered as a burned memory cell. Thus, a burned memory cell can include a memory cell having an irreversible state and such an irreversible state was placed in that memory cell because that memory cell was determined to be defective based on monitoring of information retrieved from that memory cell. The irreversible state is an identifiable state, meaning that when a memory cell (e.g., a burned memory cell) having the irreversible state is accessed during an operation (e.g., read operation of memory device 110), memory device 110 can determine that the state of that memory cell is the irreversible state.

The technique described herein may allow cache controller 120 to adaptively adjust ECC and manage memory operations in cache memory 104, such as to adjust (e.g., reduce) the scrub rate in cache memory 104 and to treat burned memory cells as if they were normal memory cells during an operation (e.g., a write operation) of storing information in memory cells of memory device 110. As mentioned above, the scrub rate may be adjusted after a memory cells is determined to be defective (or after a number of memory cells are determined to be defective) and placed in a state (e.g., an irreversible state) that is distinguishable from the state that normal memory cells have. Adjusting the scrub rate may improve (e.g., reduce) power consumption in cache memory 104. Storing information in burned memory cells may improve yield of memory device 110 or may allow the size (e.g., area) of memory device 110 to be relatively small for the same storage capacity compared with some conventional memory devices.

Cache memory 104 can include structures and perform operations of a cache memory described below with reference to FIG. 2 through FIG. 12.

Figure 2:
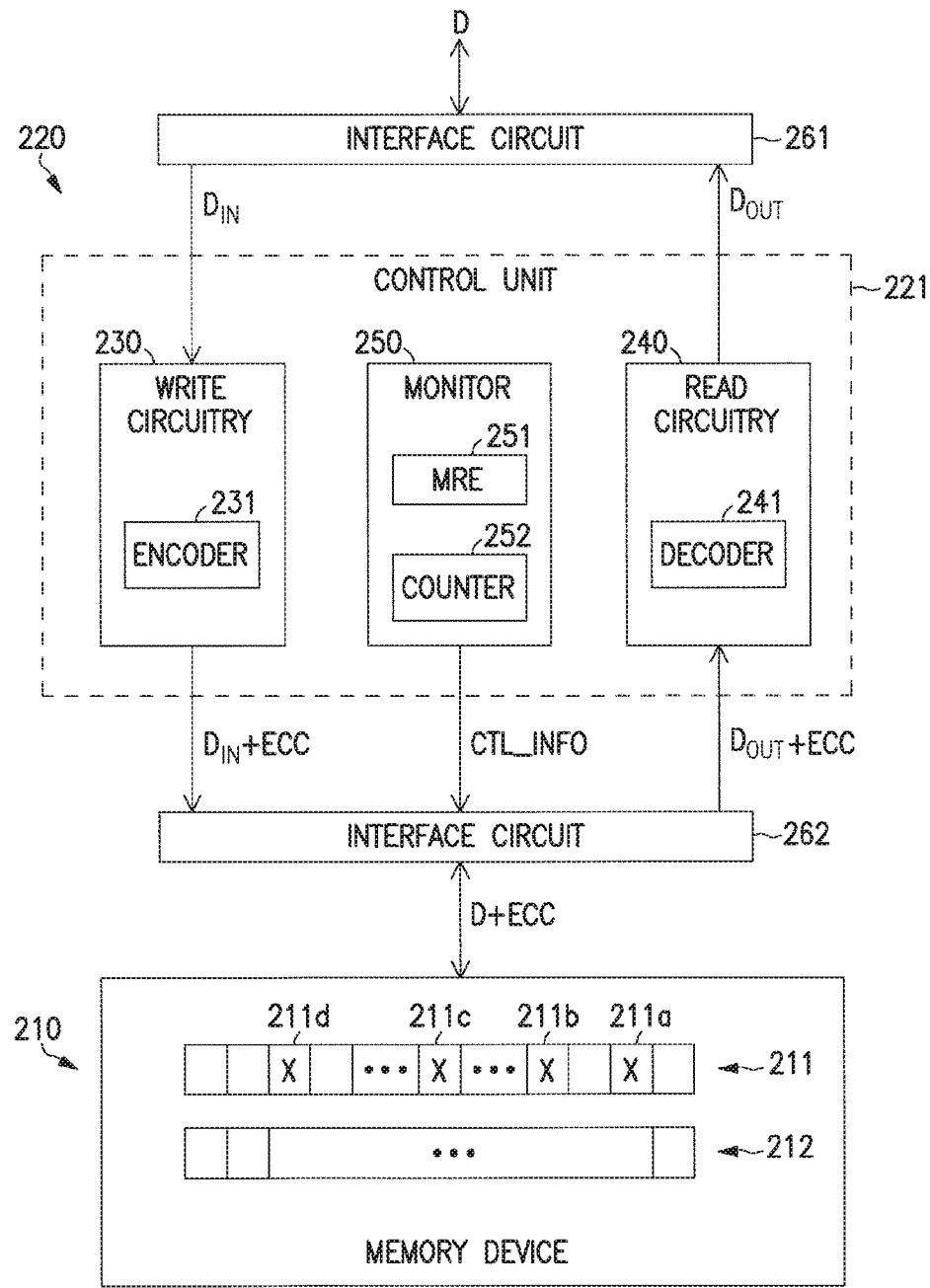
FIG. 2 shows a block diagram of a cache memory, according to some embodiments described herein.

FIG. 2 shows a block diagram of a cache memory 204, according to some embodiments described herein. Cache memory 204 can be included in an apparatus such as processor 100. Thus, cache memory 204 can include cache memory 104 of FIG. 1. As shown in FIG. 2, cache memory 204 can include a memory device 210 and a cache controller 220. FIG. 2 shows an example where cache controller 220 is located inside cache memory 204. Alternatively, cache controller 220 can be located outside cache memory 204. For example, cache controller 220 can be located inside a control block of a processor, such as control block 101 of processor 100.

As shown in FIG. 2, cache controller 220 can include an interface circuit 261 to communicate with another component (e.g., control block 101 of FIG. 1) outside cache memory 204. Data D at interface circuit 261 represents either data Din (e.g., input data) during write operation or data DOUTTT (e.g., output data) during a read operation.

Cache controller 220 can include an interface circuit 262 to communicate with memory device 210. Information D+ECC communicated (e.g., transferred) between memory device 210 and interface circuit 262 represent either information $D_{IN}$+ ECC or $D_{OUT}$+ ECC. For example, during a write operation, information D+ECC represents information $D_{IN}$+ ECC provided by cache controller 220 to be stored in memory device 210. During a read operation, information D+ECC represents information $D_{OUT}$+ ECC retrieved from memory device 210 by cache controller 220.

Cache controller 220 and memory device 210 may exchange other information through interface circuit 262 during read and write operations. Such other information may include read and write control information (e.g., signals), clock signal, and other control information (e.g., control information CTL_INFO).

As shown in FIG. 2, cache controller 220 can include a control unit 221, which can include mite circuitry 230, read circuitry 240, and a monitor 250. Write circuitry 230 can operate during an operation (e.g., a write operation) of storing (e.g., writing) information D+ECC in memory device 210. Write circuitry 230 can include an encoder 231 to perform an encode operation to encode data $D_{IN}$ with ECC and generate information $D_{IN}$+ ECC. Cache controller 220 may store both $D_{IN}$+ ECC in memory device 210 during a write operation.

Read circuitry 240 can operate during an operation (e.g., read operation) of retrieving (e.g., reading) information D+ECC from memory device 210. Read circuitry 240 can include a decoder 241 to perform a decoding operation on information $D_{OUT}$+ ECC to provide data $D_{OUT}$. Read circuitry 240 can operate to detect and correct an error (or errors) in information $D_{OUT}$+ ECC, such that the value of data $D_{OUT}$ during a read operation can be the same as the value of corresponding data $D_{IN}$ stored in memory device 210 during a write operation.

Encoder 231 may encode data (e.g., during a read operation) with ECC using techniques, such as Reed-Solomon, Bose-Chaudhuri-Hocquenghem (BCH), or other techniques. Decoder 241 may decode information retrieved from memory device 210 (e.g., during a write operation) using the same technique that encoder 231 uses.

Monitor 250 can operate to monitor errors in information $D_{OUT}$+ ECC. For example, cache controller 220 can track errors in information $D_{OUT}$+ ECC and generate error tracking information. The error tracking information can include a record (e.g., history) of particular memory cells of memory device 210 where the bits of information retrieved from such particular memory cells have errors. Based on the monitoring of errors in information $D_{OUT}$+ ECC (e.g., based on the error tracking information), monitor 250 can generate control information CTL_INFO. Control information CTL_INFO may include information (e.g., physical address) of a particular memory cell among memory cells in memory device 210 that is determined (e.g., identified) to be defective.

Memory device 210 includes memory cells that can be arranged in an array (e.g., arranged in group, such as blocks, in an array of memory cells). For simplicity, only two memory cell groups 211 and 212 are shown. Each of memory cell groups 211 and 212 can store information, which may include data (e.g., $D_{IN}$), ECC, or both. Memory cell group 211 can be configured to include a cache line (or multiple cache lines) of cache memory 204. Similarly, memory cell group 212 can be configured to include a cache line (or multiple cache lines) of cache memory 204. FIG. 2 shows an example of two cache lines formed by two corresponding memory cell groups 211 and 212. Each of the two cache lines can store information, which may include data (e.g., $D_{IN}$), ECC, or both.

Each of memory cells in memory device 210 can be configured to have different states (e.g., normal states) to indicate different values of information stored in each memory cell. For example, the normal states may include a state configured to indicate a value (e.g., binary 0) of information stored in a memory cell and another state configured to indicate another value (e.g., binary 1) of information stored in the memory cell. Memory device 210 can cause a memory cell to change from a normal state to a particular state if that memory cell is determined to be detective. A normal state is a changeable state. The particular state may be an irreversible state (e.g., an unchangeable state). For example, after receiving control information CTL_INFO from cache controller 220 indicating that memory cell 211a is determined to be defective, memory device 210 can perform an operation (e.g., a special write operation) to cause the state of memory cell 211a to change to a particular state that is irreversible. This means that after memory cell 211a has such particular state, memory cell 211a may not be able to change back to a normal state. The irreversible state may allow cache controller 220 to use a decode operation (as described in more detail below) to determine the value of information store in memory cell 211a.

FIG. 2 shows an example where memory cell group 211 includes memory cells 211a, 211b, 211c, and 211d that have been determined to be defective memory cells. The state of each of memory cells 211a, 211b, 211c, and 211d has also been changed to an irreversible state (e.g., state X, as labeled in FIG. 2).

Memory device 210 may have no spare memory cells (e.g., redundant memory cells) to replace memory cells that are determined to be defective. Thus, although memory cells 211a, 211b, 211c, and 211d are determined to be defective, they may not be replaced by spare (e.g., redundant) memory cells. Therefore, memory cells 211a, 211b, 211c, and 211d are still used by memory device 210 to store information (e.g., four bits of information) as if memory cells 211a, 211b, 211c, and 211d were normal (non-defective) memory cells. The values of information stored in memory cells 211a, 211b, 211c, and 211d after they are determined to be defective can be determined by decoder 241 during a write operation, as described in more detail with reference to FIG. 5A through and FIG. 5D. Using memory cells (e.g., 211a, 211b, 211c, and 211d) determined to be defective may avoid using spare cells as replacements for the defective memory cells. This may lead to at least one of improving yield and resulting in a smaller size of memory device 210 for the same memory capacity compared with some conventional memory devices.

As mentioned above, monitor 250 can monitor errors in information (e.g., $D_{OUT}$+ ECC) retrieved from memory cells (e.g., memory cells in memory cell groups 211 and 212) and generate control information CTL_INFO. Monitor 250 can generate control information CTL_INFO when a condition is met. For example, as described above each of memory cell groups 211 and 212 can include a cache line. The cache line can be protected with an ECC. Each time monitor 250 detects an error in the information retrieved from the cache line (e.g., from memory cell group 211 or 212), the location (e.g., physical address of memory cells 211a, 211b, 211c, or 211d) of the memory cell containing the erroneous bit can be saved. Cache memory 204 may include a pointer, e.g., most recent error (MRE) pointer 251, to store the location of the memory cell that contains the bit where the most recent error has occurred. If multiple bits having errors are detected in one cache line (e.g., memory cell group 211) in the same read operation, then the location of the memory cell containing the bit at a lower bit position (e.g., closer to the least significant bit (LSB) position) can be saved in MRE pointer 251. For example, before memory cells 211a and 211b are determined to be defective, if memory cell 211a contains a bit that is in a lower bit position than the bit position of the bit contained in memory cell 211b, then the location of memory cell 211a may be saved in MRE pointer 251 if both memory cells 211a and 211b contain bits that have errors detected during a read operation.

Cache memory 204 may include a counter 252 to keep a number that indicates a number of occurrences (e.g., consecutive occurrences) that a bit stored in a memory cell has errors. The errors can be based on a number read operations (e.g., consecutive read operations) for the same bit. If the number in counter 252 reaches a limit (e.g., a predetermined threshold value set by cache controller 220), then the memory cell associated with that bit (i.e., the bit having consecutive errors) can be determined to be defective. Monitor 250 can generate control information CTL_INFO when the limit in counter 252 is reached. In response to control information CTL_INFO, memory device 210 may perform an operation to change the state of the memory cell determined to be defective from a normal state to an irreversible state.

In FIG. 2, each of MRE pointer 251 and counter 252 can include memory (e.g., memory cells, registers, latches) to store information associated with the bit that has the most recent error and the number of consecutive times that a bit has an error, as described above. FIG. 2 shows MRE pointer 251 and counter 252 being located in cache controller 220 of cache memory 204 as an example. Alternatively, MRE pointer 251, counter 252, or both can be located in memory device 210 of cache memory 204.

As described above, encoder 231 encode data with ECC and decoder 241 can decode information based on the same ECC. The ECC described herein can correct "t" random errors when 2t<d, where "d" is the minimum Hamming distance of the code. The same ECC (e.g., base ECC) can be used to detect bits associated with (e.g., stored in) burned memory cells (e.g., memory cells having state X) and t random errors as long as e+2t<d. This means that the same ECC can correct twice as many bits associated with burned memory cells as random error bits. The number of bits associated with memory cells determined to be defective may gradually increase when the number of erroneous bits in the cache lines (e.g., cache lines included in memory cell groups 211 and 212) increases.

When MRE pointer 251 becomes empty (e.g., when no more errors (e.g., random errors) are detected in the cache lines included in memory cell groups 211 and 212), the cache controller 220 may relax some of the reliability criteria (e.g., scrub rate). Relaxing reliability criteria may cause new errors (e.g., failures) on bits that previously had no errors. The new errors can also be identified. This process can continue until most of the cache lines approach the maximum allowed number of memory cells that can be placed in state X (because of errors associated with such memory cells).

As described above, memory cells determined to be defective may still be used to store information. The detection process of bits stored in memory cells having state X is the same as that of detecting bits to be stored in normal memory cells (e.g., non-defective memory cells). The encode operation (e.g., performed by encoder 231) to encode data (e.g., data $D_{IN}$) to be stored in both normal memory cells and burned memory cells can be the same as the encoding (e.g., base encoding) operation to encode data (e.g., data $D_{IN}$) to be stored in normal memory cells. Thus, no additional ECC overhead may be associated with the encoding of data to be stored in memory cells including the burned memory cells. Decoding of information retrieved from memory cells of memory device 210 is described below with reference to FIG. 5A through FIG. 5D.

Figure 3:
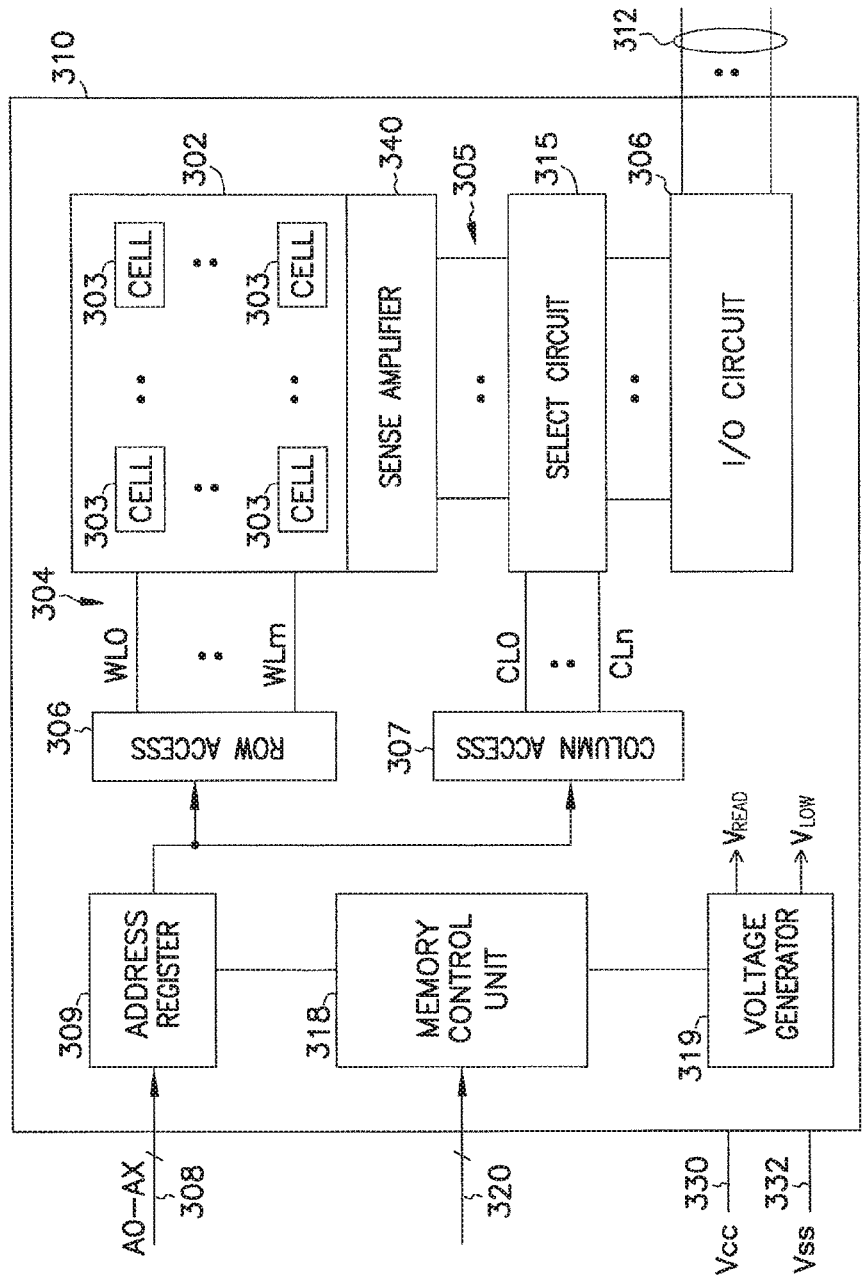
FIG. 3 shows a block diagram of a memory device, according to some embodiments described herein.

FIG. 3 shows a block diagram of a memory device 310, according to some embodiments described herein. Memory device 310 can correspond to memory device 110 of FIG. 1 or memory device 210 of FIG. 2. As shown in FIG. 3, memory device 310 can include access lines (e.g., word lines) 304, data lines 305 (e.g., bit lines) and a memory array 302 having memory cells 303 arranged in rows and columns. Access lines 304 can carry signals (e.g., access line signals) WL0 through WLm. Data lines 305 can carry signals that represent information (e.g., $D_{IN}$+ ECC) retrieved from the memory cells 303 during a read operation or information e.g., $D_{OUT}$ and ECC) to be stored in the memory cells 303 during a write operation.

Memory device 310 can include an address register 309 to receive address signals A0 through AX on lines (e.g., address lines) 305, row access circuitry (e.g., row decoder) 306 and column access circuitry (e.g., column decoder) 307 that can respond to address signals A0 through AX to determine which memory cells 303 are to be selected in a memory operation. Memory device 310 can perform an operation (e.g., a write operation) to store information in selected memory cells 303, and another operation (e.g., a read operation) to retrieve information from selected memory cells 303.

Memory device 310 can include a sense amplifier (e.g., sense circuitry) 340 that performs functions (e.g., sensing function) on data lines 305 to determine the values (e.g., bit values) of information presented by signals on data lines 305. For example, sense amplifier 340 can operate to determine the values of information to be stored in selected memory cells 303 during a write operation, and the values of information retrieved from selected memory cells 303 during a read operation.

A memory control unit 318 can control the memory operations (e.g., read and write operations) of memory device 310 based on control signals on lines 320. Examples of control signals on lines 320 include write enable signal, a clock signal and other signals. Memory device 310 may also receive control information CTL_INFO on lines 320 to change a state of one of memory cells 303 to an irreversible state.

Memory device 310 can include lines 330 and 332 to receive supply voltages Vcc and Vss, respectively. Supply voltage Vss can operate at a ground potential (e.g., having a value of approximately zero volts). Supply voltage Vcc can include an external voltage supplied to memory device 310 from an external power source such as a battery or an alternating-current to direct-current (AC-DC) converter circuitry.

Memory device 310 can include a voltage generator 319 to generate voltages, such as voltages $V_{READ}$ and $V_{LOW}$ for use during memory operations (e.g., read operation) of memory device 310. During a read operation (e.g., read operations described below with reference to FIG. 6 through FIG. 10), voltages $V_{READ}$ and $V_{LOW}$ may be used at different times in the read operation to determine states (e.g., the values of information) in selected memory cells 303.

As shown in FIG. 3, memory device 310 can have a select circuit 315 that can respond to select signals CL0 through CLn during a memory operation (read or write) in order to select lines 305 associated with selected memory cells during such operation. The levels of signals (e.g., voltage or current) on the selected lines 305 among lines 305 may allow memory device 310 to determine the values of information to be stored in (e.g., in a write operation) or retrieved from (e.g., in a read operation) the selected memory cells.

Column access circuit 307 can selectively activate the CL0 through CLN signals based on the address signals A0 through AX. Select circuit 315 can select signals D0, D0*, DN, and DN* and then provide them to an input/output (I/O) circuit 316.

Memory device 310 can include input/output (I/O) circuit 316 to receive information (e.g., data D and ECC) from lines (e.g., I/O lines) 312 during a write operation or provide information to lines 312 during a read operation. The information on lines 312 can be similar to that of information D+ ECC communicated between cache controller 220 and memory device 210 of FIG. 2.

Memory device 310 may include a spin-torque transfer random access memory (STT-RAM) device, a dynamic random access memory (DRAM) device, a static random access memory (SRAM) device, a flash memory device, resistive memory device, magnetic memory device, phase change memory device, monies memory device, ferroelectric memory device, or another type of memory device. Memory device 310 may include other components, which are not shown in FIG. 3 to help focus on the embodiments described herein.

FIG. 4A through FIG. 4E show schematic diagrams of a memory cell 403 and structures of memory cell 403 in different states, according to some embodiments described herein. Memory cell 403 can be one of memory cell 303 of memory cells of a memory device, such as memory device 110, 210, or 310 described above with reference to FIG. 1 through FIG. 3.

Figure 4A:
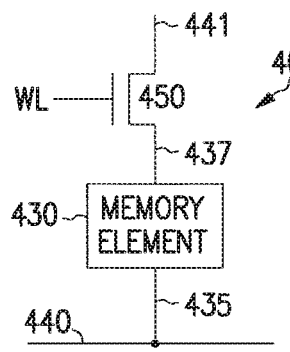
FIG. 4A through FIG. 4E show schematic diagrams of a memory cell and structures of the memory cell in different states, according to some embodiments described herein.

As shown in FIG. 4A, memory cell 403 can include a memory element 430 and an access component 450; both can be coupled (e.g., located) between lines 440 and 441. Line 440 can be part of a source line. Line 441 can be part of a data line (e.g., bit line) that can be part of a circuit path coupled to a sense amplifier (e.g., sense amplifier 340 in FIG. 3). FIG. 4A shows access component 450 including a transistor as an example. Access component 450 can include a component different from a transistor.

Memory element 430 can be configured to store information. Access component 450 can be selected (e.g., turned on) to access memory cell 403 in order to store information in memory element 430 (e.g., during a write operation) or to retrieve information from memory element 430 (e.g., during a read operation). Access component 450 can also be selected to access memory cell 403 in order to change (e.g., permanently change) the state of memory cell 403, such as changing the state of memory cell 403 to an irreversible state. Memory cell 403 can include contacts 435 and 437 coupled to respective sides (e.g., top and bottom) of memory element 430.

FIG. 4A shows an example arrangement of memory cell 403 where memory element 430 is located (e.g., physically formed) between access component 450 and node 440. Memory cell 403, however, can have another arrangement.

Figure 4B:
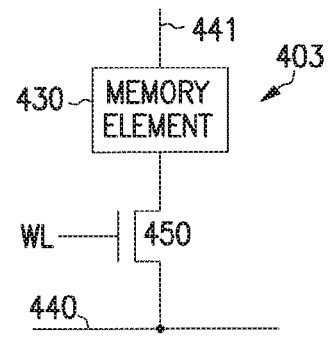

FIG. 4B shows a schematic diagram of an alternative arrangement of memory cell 403 of FIG. 4A. For example, as shown in FIG. 4B, access component 450 can be located (e.g., physically formed) between memory element 430 and node 440.

Memory cell 403 (FIG. 4A and FIG. 4B) can include a resistive type memory, such that the value of information stored in memory cell 403 (e.g., stored in memory element 430) can be based on the resistance of memory element 430. For example, memory element 430 can be configured to have different resistances (e.g., different states) to present different values of information stored in memory cell 403. Alternatively, memory cell 403 can include a memory type different from resistive type memory.

Figure 4C:
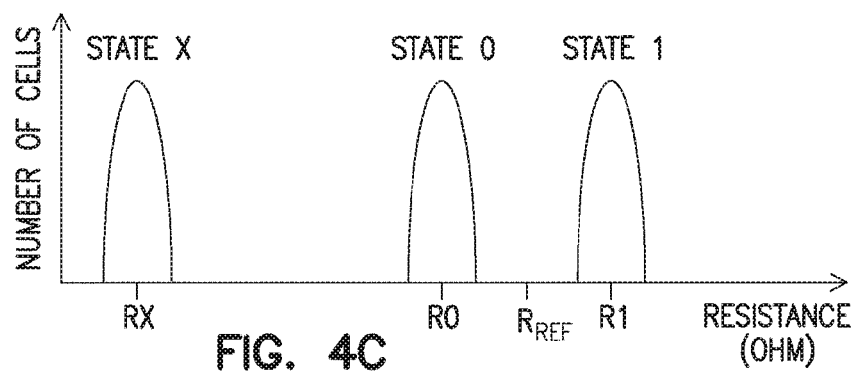

FIG. 4C is a graph showing example resistances RX, R0, and R1 and corresponding states x, state 0, and state 1 for a number of memory cells, according to some embodiments described herein. The memory cells associated with FIG. 4C include memory cell 403 (FIG. 4A) and can be memory cells of a memory device, such as memory device 110, 210, or 310 described above with reference to FIG. 1 through FIG. 3. Resistances RX, R0, and R1 in FIG. 4C represent possible resistances that a number of memory cells of a memory device may have (e.g., after a write operation). FIG. 4C also shows a resistance $R_{REF}$, which represents the resistance across a memory element of a reference memory cell (not shown in FIG. 4A through FIG. 4C).

Resistances RX, R0, and R1 can correspond to state X, state 0, and state 1. State 0 can indicate that information stored in memory cell 403 has a particular (e.g., binary 0) value. State 1 can indicate information stored in memory cell 403 has another particular value (e.g., binary 1). State X can indicate that information stored in memory cell 403 has either a value associated with state 0 or a value associated with state 1. Memory cell 403 can be placed in state X if it is determined to be defective (e.g., based on monitoring of errors in information retrieved from memory cell 403 by monitor 250 of FIG. 2). For example, if memory cell 403 is determined to be defective, an operation (e.g., special write operation) can be performed to change the state of memory cell 403 from either state 0 or state 1 to state X. Memory cell 403, however, may still be used as a normal memory cell after it is determined to be defective and placed in state X.

In FIG. 4C, resistance RX can have a value different from resistance R0 and resistance R1. For example, resistance RX can have a value less than the value of resistance R0 (e.g., a value between zero and the value of resistance R0). Resistance Ref can have a value between the values of resistances R0 and R1. Resistances RX, R0, and R1 can be referred to as relatively super low resistance, low resistance, and high resistance, respectively. Example values of resistances R0 and R1 can be approximately 4K ohms and approximately 8K ohms, respectively. Resistance RX can between 0 and 4K ohms, such as in the hundred ohm range (e.g., approximately 100 ohms).

Memory cell 403 can be placed in state 0 during a write operation if a bit of information stored in memory cell 403 has one value (e.g., binary 0) or placed in state 1 if a bit of information stored in memory cell 403 has another value (e.g., binary 1).

The state (e.g., state 0 or state 1) of memory cell 403 can be based on the relative orientation of the magnetization of materials 431 and 433 (FIG. 4D-4F) in memory element 430. In a write operation, a write current (e.g., a directional spin polarized current) may be used to cause the magnetic orientation of one of materials 431 and 433 (e.g., material 433) to change, thereby changing the state of memory cell 403 to indicate the value of information stored in memory cell 403.

For example, if a bit having a value of binary 1 is to be stored in memory cell 403, a positive voltage can be applied across memory element 430 (e.g., a voltage at contact 437 can be greater than a voltage at contact 435). This can cause the magnetic orientation of one of materials 431 and 433 to change, such that the magnetic orientations of materials 431 and 433 are anti-parallel (as shown in FIG. 4D). If a bit having a value of binary 0 is to be stored in memory cell 403, a negative voltage can be applied across memory element 430 (e.g., a voltage at contact 437 can be less than a voltage at contact 435). This can cause the magnetic orientation of one of materials 431 and 433 to change, such that the magnetic orientations of materials 431 and 433 are parallel (as shown in FIG. 4D).

Each of state 0 and state 1 is a normal state (e.g., a changeable state) For example, if memory cell 403 is in state 0 (e.g., currently storing a binary 0 bit), a write operation can change state 0 to state 1 if new information stored in memory cell 403 has a different value (e.g., binary 1). In another example, if memory cell 403 is in state 1 (e.g., currently storing a binary 1 bit), a write operation can change state 1 to state 0 if new information stored in memory cell 403 has a different value (e.g., binary 0). Thus, each of state 0 and state 1 is not an irreversible (e.g., not permanent) because state 0 or state 1 can be changed to a different state.

State X may be an irreversible state. This means that after memory cell 403 is placed in state X, memory cell 403 may remain in state X. State X may be unable to be changed (may not be changed) to either state 0 or state 1.

A current $I_{CELL}$ in FIG. 4A represents a current across the memory element 430 during a read operation. The value of current $I_{CELL}$ during a read operation is proportional to the value of the resistance (e.g., RX, R0, or R1) of memory element 430. In a read operation, the value of current $I_{CELL}$ can be compared with the value of current $I_{REF}$ (not shown in FIG. 4A) in order to determine the state of memory cell 403. Current $I_{REF}$ is a current across a reference memory cell during a read operation. The value of current $I_{REF}$ is proportional to the value of reference resistance $R_{REF}$ (FIG. 4C) of the reference memory cell.

Figure 4F:
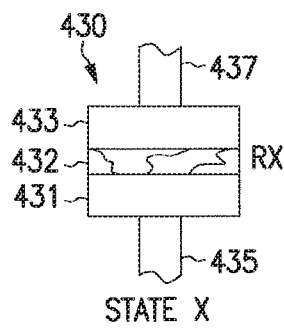
Figure 4D:
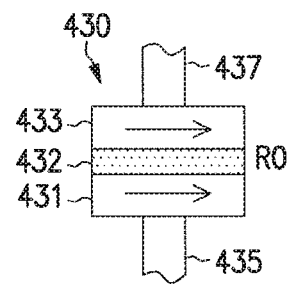
Figure 4E:
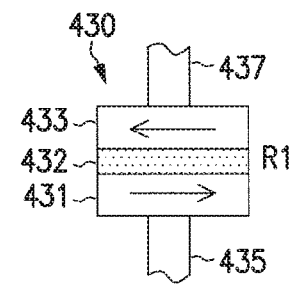

FIG. 4D, FIG. 4E, and FIG. 4F show example structures of memory element 430 in different states. As shown in FIG. 4D, memory element 430 can include a material 431 (e.g., a layer of material 431), a material 433 (e.g., a layer of material 433), and material 432 (e.g., a layer of material 432) sandwiched between materials 431 and 432.

Each of materials 431 and 433 can include ferromagnetic material (e.g., ferromagnetic layer). Material 432 can include a dielectric material (e.g., a dielectric layer). An example of material 432 includes an oxide material (e.g., MgO). Material 432 may include a dielectric material besides an oxide material. Materials 431, 432, and 433 may form a magnetic tunnel junction (MTJ). The MTJ combines with access component 450 (FIG. 4A) form STT-RAM memory cell.

The arrows in materials 431 and 433 indicate example magnetic orientations in these materials. One of materials 431 and 433 (e.g., material 431) can have a fixed magnetic orientation (e.g., hard layer), the other material (e.g., material 433) can have a variable magnetic orientation (e.g., free layer). In a write operation, an appropriate amount of current can change the magnetic orientation of one of materials 431 and 433, depending on the value of information stored in memory cell 403.

In FIG. 4D, memory element 430 may exhibit a relatively lower resistance (e.g., resistance R0) when the magnetic orientations of materials 431 and 433 are in parallel (P). In FIG. 4E, memory element 430 may exhibit a relatively higher resistance (e.g., resistance R1) when the magnetic orientations of materials 431 and 433 are anti-parallel (not parallel) (AP). Although magnetic orientations in memory element 430 in FIG. 4D and FIG. 4E are different (P) and (AP), the structure of material 432 (e.g., dielectric material) of memory element 430 in FIG. 4D and FIG. 4E may be substantially similar or may be the same.

In FIG. 4F, the structure (e.g., physical structure, chemical structure, or both) of material 432 of memory element 430 is different from material 432 of memory element 430 in FIG. 4D and FIG. 4E. For example, in FIG. 4F, material 432 may be intentionally damaged (e.g., intentionally "burned" during a burn process) during an operation in order to cause the resistance (e.g., RX) across memory element 430 in FIG. 4F to be different from (e.g., substantially less than) the resistance (e.g., R0) across memory element 430 in FIG. 4D. For example, in a special write operation (e.g., a "burn" process) performed by a memory device that includes memory cell 403, a larger amount of current (relative to the amount of current in a normal write operation to store information in memory cell 403) may be applied to memory cell 403. The higher amount of current is used to intentionally cause the structure of material 432 (e.g., MgO) of memory cell 403 (FIG. 4F) to break down, such that the structure of material 432 may be associated with state X that is different from the structure of material 432 associated with state 0 (FIG. 4D) or state 1 (FIG. 4E). In some situations, material 432 is damaged such that materials 431 and 433 may directly contact each other, thereby causing the resistance (e.g., RX) across memory element 430 in FIG. 4F to be substantially low (e.g., in the hundred ohm range or less).

A write operation may store a bit (e.g., either binary 0 or binary 1) of information in memory cell 403 in the same way that the write operation stores the bit in memory cell 403 as if memory cell 403 is not in state X. Memory cell 403 may remain at state X regardless of the value (e.g., binary 0 or 1) of information stored in memory cell 403 after a write operation.

A read operation described herein (e.g., with reference to FIG. 6 through FIG. 10) includes techniques to determine the state (state X, state 0, or state 1) of memory cell 403. An example decode operation (which includes error detection and correction operation) described below with reference to FIG. 5A through FIG. 5D includes techniques to determine the correct value (e.g., binary 0 or 1) stored in memory cell 403 even if memory cell 403 has state X.

Figure 5A:
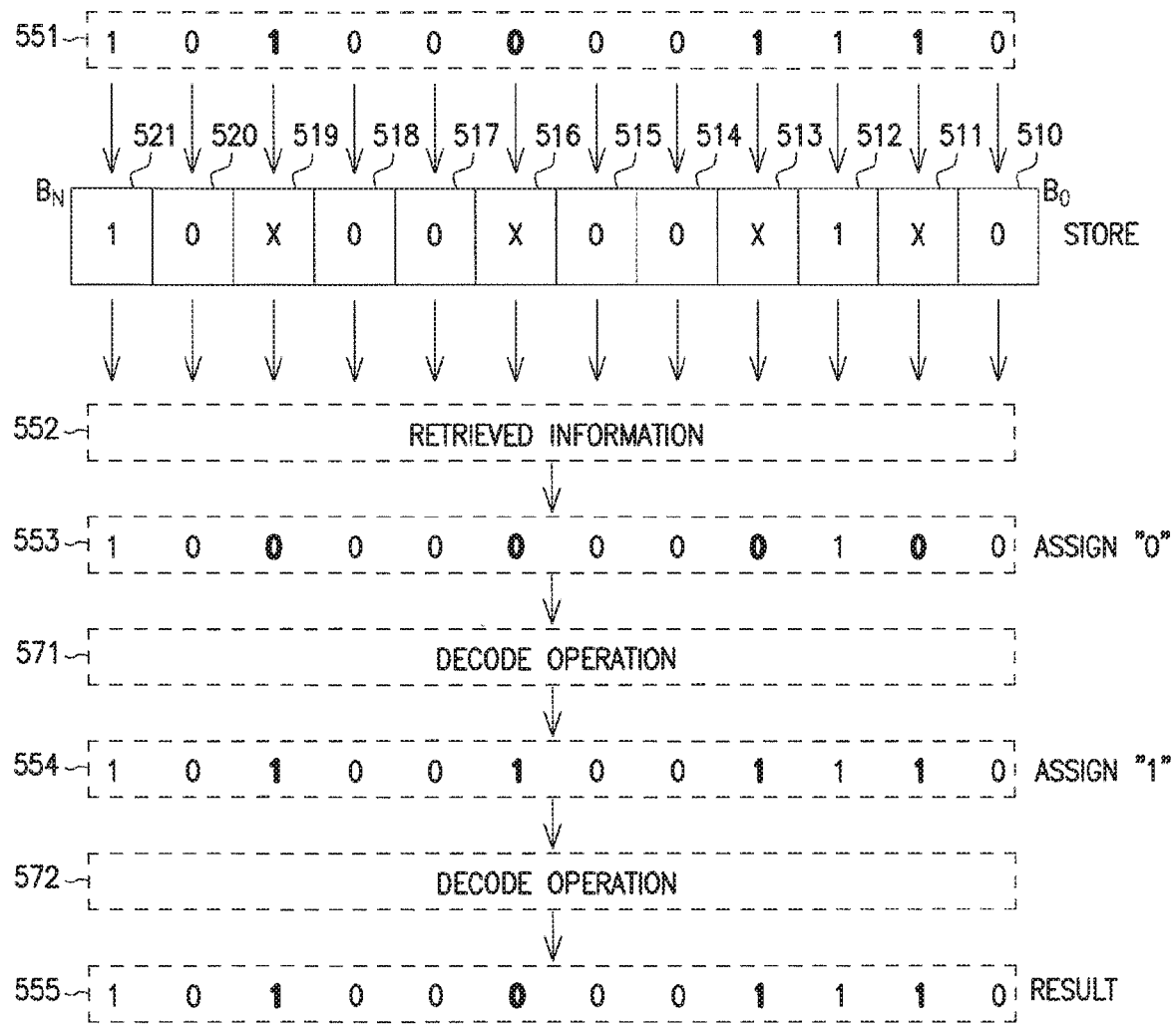
FIG. 5A shows an example of storing information in and retrieving information from memory cells where retrieved information includes bits associated with burned memory cells, according to some embodiments described herein.

FIG. 5A shows an example of storing information in and retrieving information from memory cells 510 through 521 where retrieved information includes bits associated with burned memory cells, according to some embodiments described herein. Memory cells 510 through 521 can include memory cells of a memory device, such as memory device 110, 210, or 310 described above with reference to FIG. 1 through FIG. 3. Memory cells 510 through 521 in FIG. 5A can be part of a cache line (e.g., cache line in memory cell group 211 or 212 of FIG. 2) or an entire cache line in a cache memory (e.g., cache memory 104 of FIG. 1).

For simplicity, FIG. 5A shows information 551 having 12 bits to be stored in 12 corresponding memory cells 510 through 521. The number of bits of information 551 and the number of memory cells can vary. Information 551 can include encoded information, such that it can include a combination of both data (e.g., bits of information that represent data) and ECC (e.g., bits of information that represent ECC). Alternatively, information 551 may include only data or only ECC associated with the data.

In FIG. 5A, B0 and BN represent bit positions (e.g., bit addresses memory cells 510 and 521, respectively. For simplicity, bit positions of other memory cells are not labeled in FIG. 5A. The bits of information stored in memory cells 510 through 521 may be organized from bit position B0 to position BN, in which bit position B0 may be designated as a lower bit position (e.g., least significant bit (LSB) position) and bit position BN may be designated as a higher bit position (e.g., most significant bit (MSB) position).

In FIG. 5A, it is assumed that, before the write operation (e.g., labeled as "STORE" operation in FIG. 5A) to store information 551 in memory cells 510 through 521, each of memory cells 511, 513, 516, and 519 has been determined to be a defective memory cell and placed in state X (as indicated by "X" in FIG. 5A), such that memory cells 511, 513, 516, and 519 can be considered as burned memory cells. Each of memory cells 511, 513, 516, and 519 may be determined to be defective based on monitoring (e.g., monitored by a controller such as cache controller 120 of FIG. 1) of errors in information in each of memory cells 511, 513, 516, and 519. The other memory cells (e.g., 510, 512, 514, 515, 517, 518, 520, and 521) in FIG. 5A are assumed to be normal (e.g., non-defective) memory cells. Thus, the state of the other memory cells in FIG. 5A can be changed between states 0 and 1 based on the value of information 551 to be stored in the other memory cells.

Since each of memory cells 511, 513, 516, and 519 is determined to be defective and having state X, the structure (e.g., physical structure, chemical structure, or both) of the memory element in each of memory cells 511, 513, 516, and 519 can be different from the structure of each of the other normal memory cells (e.g., 510, 512, 514, 515, 517, 518, 520, and 521). For example, the memory element of each of memory cells 511, 513, 516, and 519 can be similar to or identical to memory element 430 in FIG. 4F. The memory element of each of memory cells 510, 512, 514, 515, 517, 518, 520, and 521 can be similar to or identical to memory element 430 in either FIG. 4D or FIG. 4E.

Figure 12:
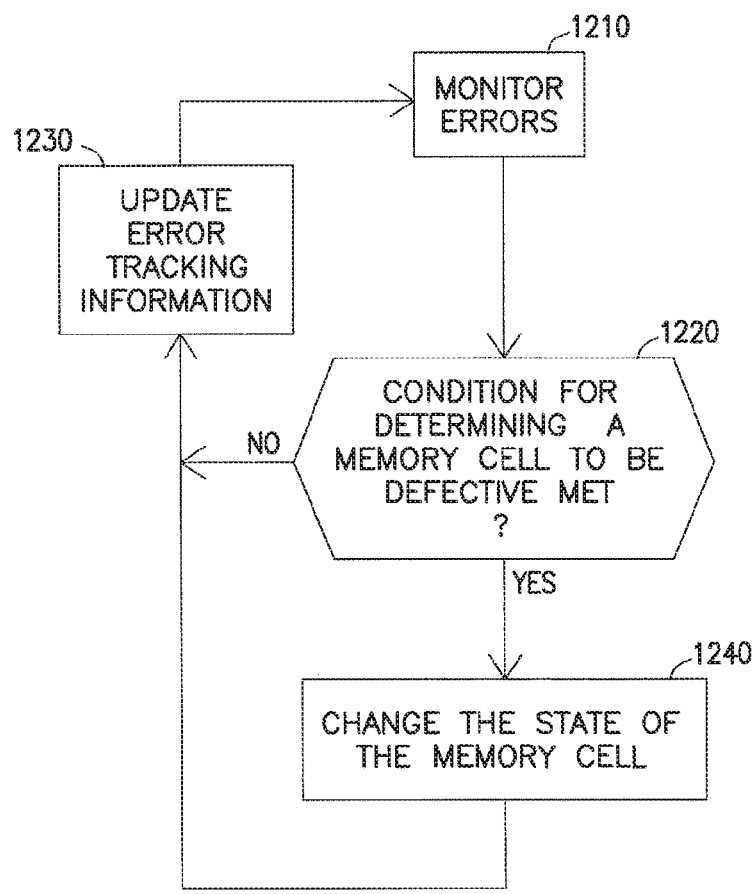
FIG. 12 is a flow diagram showing a method of monitoring errors in information retrieved from memory cells, according to some embodiments described herein.

As shown in FIG. 5A, 12 bits of information 551 may have example values of 101000001110 to be stored in corresponding memory cells 510 through 521. The four bits 1011 in bold are to be stored in four corresponding memory cells 511, 513, 516, and 519. The state of each of memory cells 511, 513, 516, and 519 can remain unchanged at state X after four bits 1011 are respectively stored in them. The states of other memory cells (e.g., 510, 512, 4, 515, 517, 518, 520, and 521) can change (e.g., from state 0 to state 1 or from state 1 to state 0) to indicate the value of information stored in these memory cells.

During a read operation, information (retrieved information) 552 is retrieved from memory cells 510 through 521. Each bit associated with each of memory cells 511, 513, 516, and 519 can be assigned with a "0" (binary 0) during an ASSIGN "0" operation (as shown in FIG. 5A) to provide information 553. Then, a decode operation 571 is performed on information 553. Decode operation 571 includes an error detection and correction operation. For simplicity, the example associated with FIG. 5A assumes that decode operation 571 can detect up to two erroneous bits and correct up to two erroneous bits. However, the decoding technique described herein can be applied to a decode operation that can detect a different number of erroneous bits (e.g., more than two erroneous bits) and can correct a different number of erroneous bits (e.g., more than two erroneous bits).

As shown in FIG. 5A, the values of 12 bits of information 553 are 100000000100. In comparison with information 551, more than two bits (bits associated with memory cells 511, 513, and 519) of information 553 have the errors. Since the example associated with FIG. 5A assumes that the decode operation can detect and correct up to two bits that have errors, decode operation 571 performed on information 553 may be unsuccessful to provide correct values (e.g., values that are the same as the values of the 12 bits data of information 551). In this case, an additional decode operation 572 is performed. Decode operation 572 includes an error detection and correction operation. For decode operation 572, each bit (among bits of information 552) associated with each of memory cells 511, 513, 516, and 519 can be assigned with a "1" (binary 1) during an ASSIGN "1" operation (as shown in FIG. 5A) to provide information 554. In comparison with information 551, only one bit (bit associated with memory cell 516) in information 554 has an error. Thus, decode operation 572 can successfully decode information 554 and provide information 555 with correct result (label as "RESULT" in FIG. 5A), which includes 12 bits that have the same values (e.g., correct values 101000001110) as 12 bits of information 551. Information 555 may be used to provide data (e.g., $D_{OUT}$).

The example read operation above assumes that multiple memory cells (e.g., 511, 513, 516, and 519) among memory cells 510 through 521 are determined to be defective. However, in some situations, only one memory cell (instead of multiple memory cells) among memory cells 510 through 521 may be determined to be defective.

The example read operation above assigns "0" and then "1" (if necessary) to each bit associated with each of memory cells 511, 513, 516, and 519. However, the order of assigning "0" and "1" can be switched. For example, "1" may be assigned for decode operation 571 and "0" may be assigned for an additional operation (e.g., 572) if needed.

The example read operation above assumes that no errors have occurred in the bits stored in the normal memory cells (e.g., 510, 512, 514, 515, 517, 518, 520, and 521). However, if errors occurred in any of the normal memory cells, the decoding described herein can also detect and correct such errors.

As described above, two decode operations (e.g., 571 and 572) may be performed to provide correct data. Both decode operations may not provide correct data. However, in one of the decode operations, less than half of the bits associated with (e.g., stored in) memory cells determined to be defective (e.g., memory cells having state X) may have erroneous values before decoding. This allows one of the decode operations to obtain the correct value of data (e.g., $D_{OUT}$). For example, if the number of errors is t and number of bits associated with (e.g., stored in) memory cells determined to be defective is e, then 2t+e<d, where d is the minimum Hamming distance for the ECC. The left side of the equation is equal to 2(t+e/2)<d. When less than half of the bits associated with memory cells determined to be defective have erroneous value, the decoding technique shown in the example of FIG. 5A can correct bits having random errors and bits stored in memory cells determined to be defective. Therefore, one of the decode operations described above with reference to FIG. 5A can give correct result (e.g., give $D_{OUT}$ having correct value). The latency for the decoding technique described herein may be greater (e.g., twice the latency of some conventional decoding techniques). However, logic (e.g., circuitry) and overhead may be the same as that of some conventional decoding techniques.

Figure 5B:
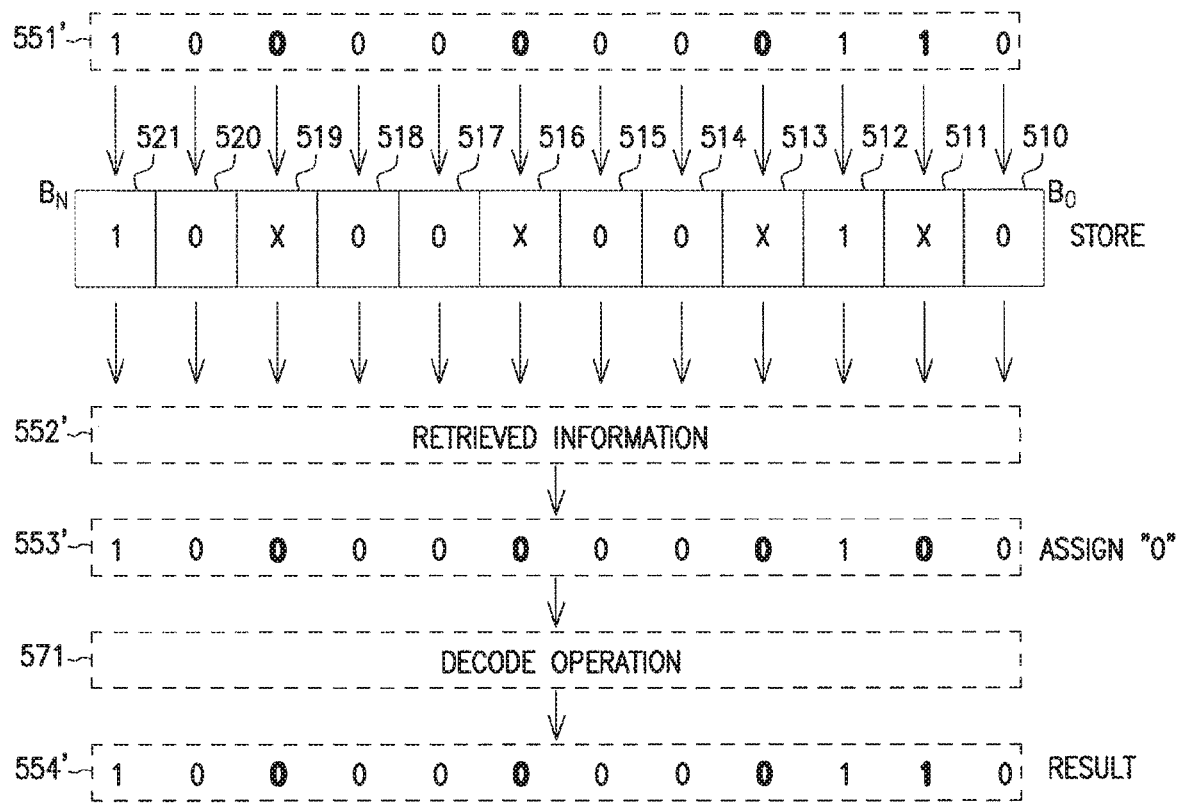
FIG. 5B shows another example of storing information in and retrieving information from memory cells where retrieved information includes bits associated with burned memory cells, according to some embodiments described herein.

FIG. 5B shows another example of storing information in and retrieving information from memory cells 510 through 521 where retrieved information includes bits associated with burned memory cells, according to some embodiments described herein. The difference between the examples associated with FIG. 5A and FIG. 5B includes a difference in values between 551 and 551' (FIG. 5B). Information 551' can include encoded information, such that it can include data and ECC associated with the data. Alternatively, information 551' may include only data or only ECC.

As shown in FIG. 5B, information 551' has 12 bits with values of 100000000110 to be stored in corresponding memory cells 510 through 521. Four of the 12 bits (0001 in bold font) of 551' are stored in four corresponding memory cells 511, 513, 516, and 519. The state of each of memory cells 511, 513, 516, and 519 can remain unchanged at state X after four bits 0001 are stored in them. The states of other memory cells can change to either state 0 or state 1 to indicate the value of information stored in these memory cells.

During a read operation, information (retrieved information 552') is retrieved from memory cells 510 through 521. Each bit associated with each of memory cells 511, 513, 516, and 519 is assigned with a "0" during an ASSIGN "0" operation (as shown in FIG. 5A) to provide information 553'. Then, decode operation 571 is performed on information 553'. The values of 12 bits of information 553' are 100000000100. In comparison with information 551', only one bit (bit associated with memory cell 514) of information 553' has an error. Since decode operation 571 can detect and correct up to two bits that have errors (as assumed above), decode operation 571 can successfully decode information 553' to provide information 554' with correct result, which includes 12 bits that have the same values (e.g., correct values 100000000110) as 12 bits of information 551'. Information 554' may be used to provide data (e.g., $D_{OUT}$).

In the example associated with FIG. 5B, since correct values of data (e.g., $D_{OUT}$) can be successfully obtained, assigning "1" to each bit (among bits of information 552') associated with each of memory cells 511, 513, 516, and 519 may be skipped. Thus, in comparison with the example associated with FIG. 5A, only one decode operation (e.g., 571) is performed in the example associated with FIG. 5B to provide data having correct values.

The examples associated with FIG. 5A and FIG. 5B assume that no errors have occurred in information retrieved from normal memory cells (e.g., 510, 512, 514, 515, 517, 518, 520, and 521). However, besides providing correct values for information stored in burned memory cells (e.g., 511, 513, 516, and 519), the techniques described herein can also detect and correct errors (e.g., random errors) that may occur in information retrieved from normal memory cells. For example, based on the techniques described herein, the same decoding process (e.g., decode operation 571, 572, or both) can operate on information that contains bits associated with burned memory cells and an erroneous bit from a normal memory cell (or erroneous bits from multiple normal memory cells) and provide information with correct result.

Figure 5C:
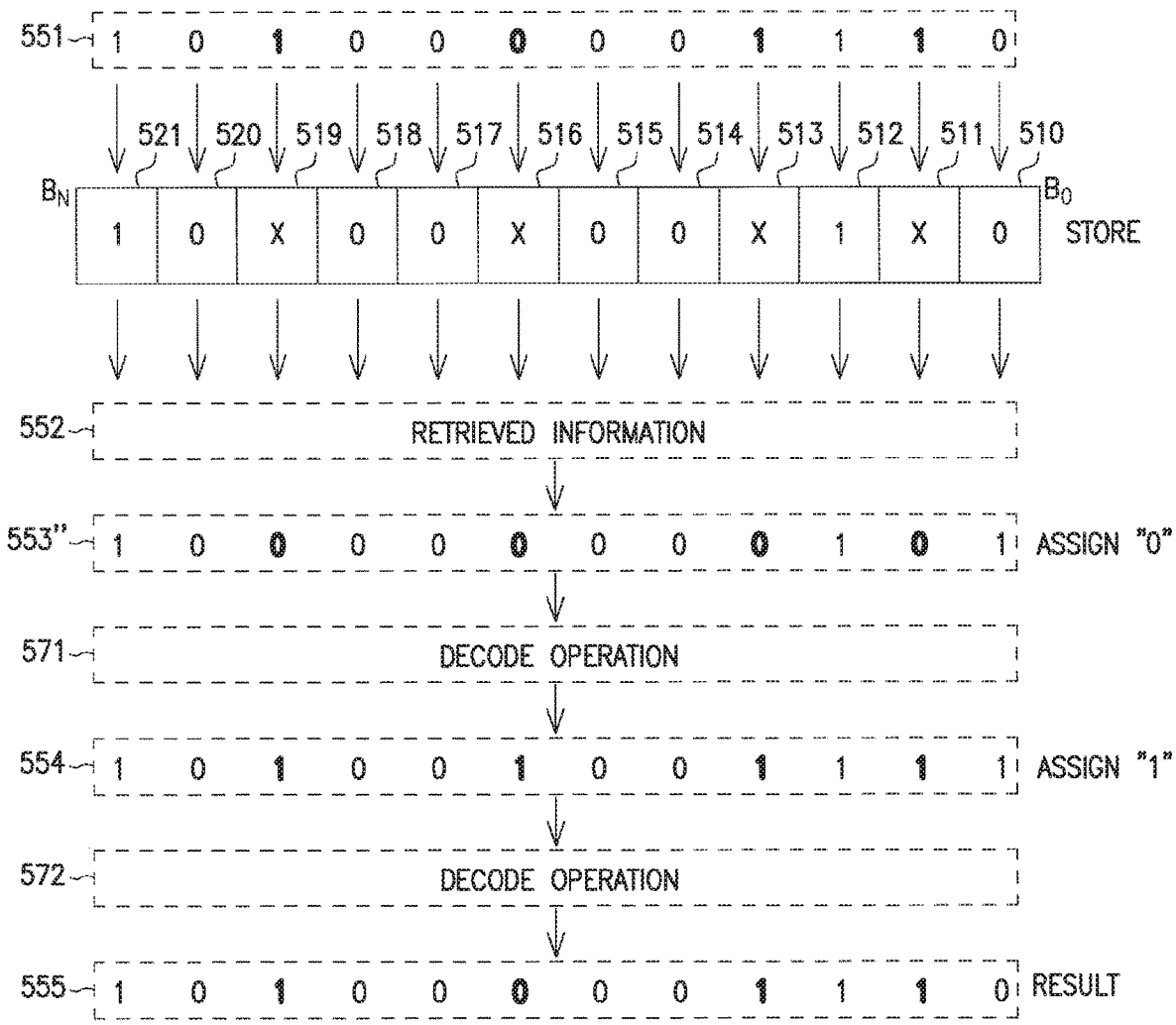
FIG. 5C shows an example of storing information in and retrieving information from memory cells where retrieved information includes bits associated with burned memory cells and an erroneous bit from a normal memory cell, according to some embodiments described herein.

FIG. 5C shows an example of storing information in and retrieving information from memory cells 510 through 521 where retrieved information includes bits associated with burned memory cells and an erroneous bit from a normal memory cell, according to some embodiments described herein. The example associated with FIG. 5C is similar to the example associated with FIG. 5A except that a bit of information retrieved from memory cell 510 (e.g., one of the normal memory cells) has an error (e.g., random error). For example, as shown in FIG. 5C, a particular bit stored in memory cell 510 (based on information 551) has a value of "0". However, that particular bit may have an erroneous value of "1" (as shown in information 553"). The erroneous bit associated with memory cell 510 and the bits (e.g., assigned bit of "0" or "1") associated with memory cells 511, 513, 516, and 519 can be detected and corrected in the same decoding process (e.g., decode operation 571, 572, or both). For example, as shown in FIG. 5C, decode operations 571 and 572 can operate to provide information 555 with correct result, which includes 12 bits that have the same values (e.g., correct values 101000001110) as 12 bits of information 551.

Figure 5D:
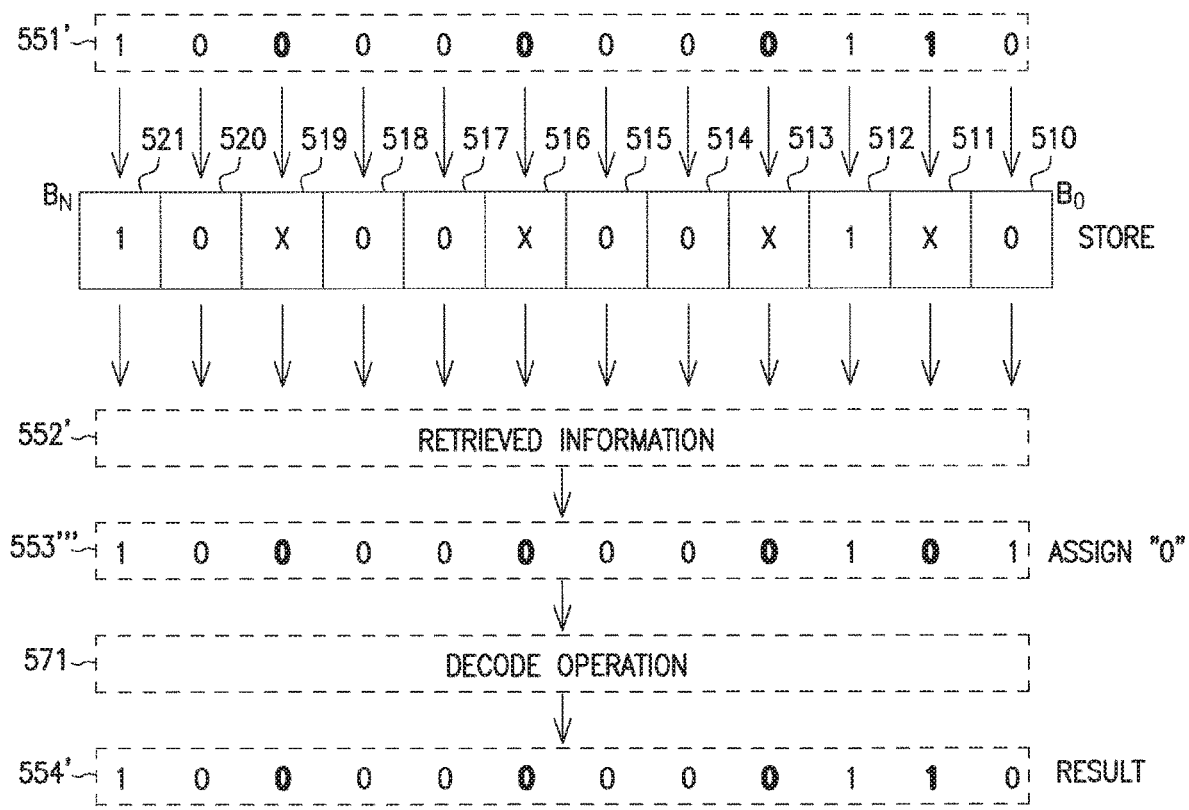
FIG. 5D shows another example of storing information in and retrieving information from memory cells where retrieved information includes bits associated with burned memory cells and an erroneous bit from a normal memory cell, according to some embodiments described herein.

FIG. 5D shows another example of storing information in and retrieving information from memory cells 510 through 521 where retrieved information includes bits associated with burned memory cells and an erroneous bit from a normal memory cell, according to some embodiments described herein. The example associated with FIG. 5C is similar to the example associated with FIG. 5B except that a bit of information retrieved from memory cell 510 (e.g., one of the normal memory cells) has an error (e.g., random error). For example, as shown in FIG. 5D, a particular bit stored in memory cell 510 has a value of "0". However, that particular bit may have an erroneous value of "1" (as shown in information 553'''). The erroneous bit associated with memory cell 510 and the bits (e.g., assigned bit of "0" or "1") associated with memory cells 511, 513, 516, and 519 can be detected and corrected in the same decoding process (e.g., decode operation 571, 572, or both). For example, as shown in FIG. 5D, decode operation 571 can operate to provide information 554' with correct result, which includes 12 bits that have the same values (e.g., correct values 101000001110) as 12 bits of information 551'.

The examples associated with FIG. 5C and FIG. 5D assume that only one bit retrieved from a normal memory cell (e.g., 510) has an error. However, besides providing correct values for information stored in burned memory cells (e.g., 511, 513, 516, and 519), the techniques described herein can also detect and correct errors (e.g., random errors) that may occur in multiple bits retrieved from two or more normal memory cells (e.g., two or more of memory cells 510, 512, 514, 515, 517, 518, 520, and 521).

As described above, although a memory cell (e.g., a burned memory cell) is determined to be defective memory cell and placed in a particular state (e.g., an irreversible state), the decoding technique described herein may allow such a memory cell (e.g., a burned memory cell) to be considered a non-defective memory cell and to be used to store information. This may allow the memory device and the cache memory to avoid using spare (e.g., redundant) memory cells, thereby yield, size, or both, associated the memory device may be improved.

Figure 6:
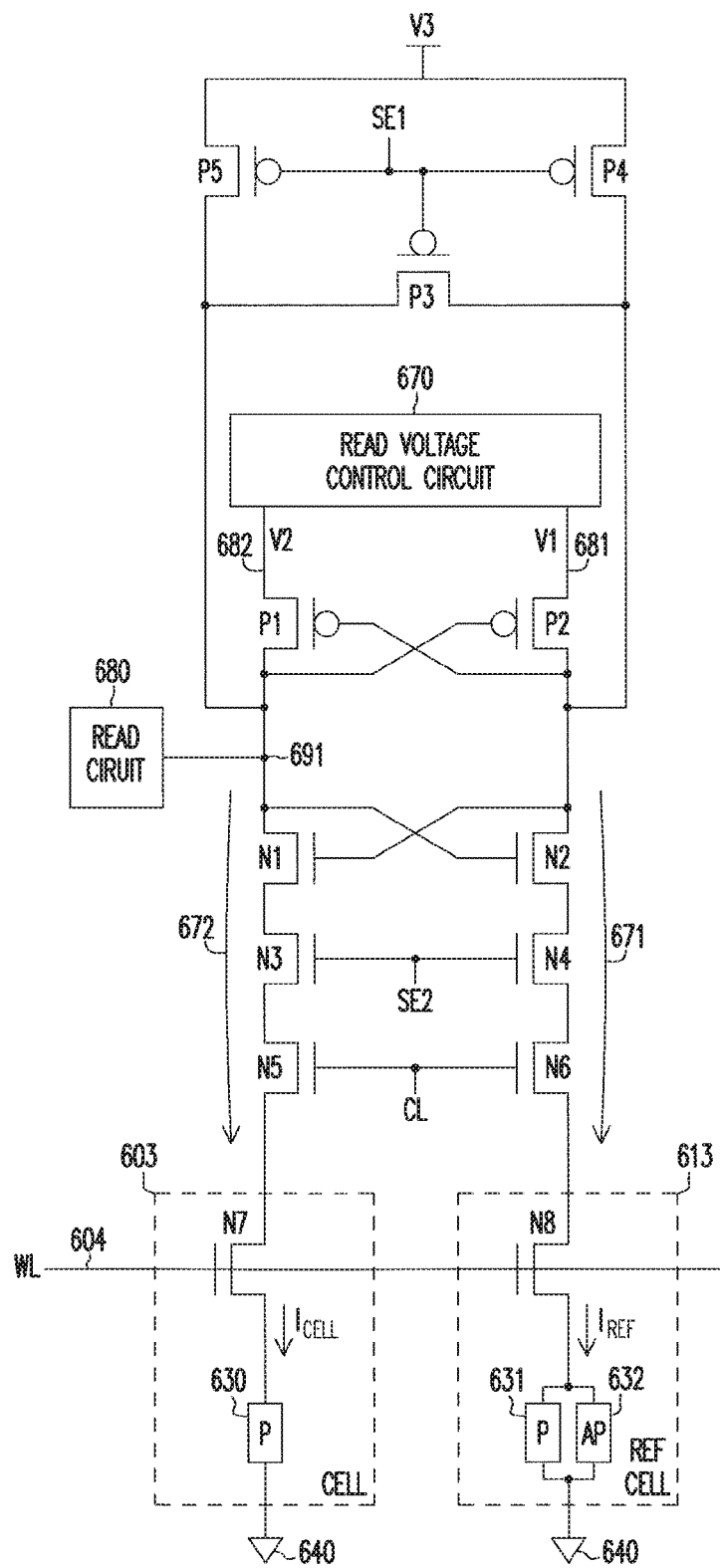
FIG. 6 shows a block diagram of a portion of a memory device, according to some embodiments described herein.

FIG. 6 shows a block diagram of a portion of a memory device 610, according to some embodiments described herein. Memory device 610 can correspond to memory device 110 of FIG. 1, memory device 210 of FIG. 2, or memory device 310 of FIG. 3. As shown in FIG. 6, memory device 610 has a reference memory cell 613. Memory cell (CELL) 603 can include a memory element 630 and transistor (e.g., access transistor) N7. Reference memory cell (REF CELL) 613 can include memory elements 631 and 632 and transistor (e.g., access transistor) N8. Memory cell 603 may be configured to store information. Memory cell 603 may not be configured to store information. During a read operation to retrieve information from memory cell 603, memory device 610 may compare the value of current $I_{CELL}$ going through memory cell 603 with the value of current $I_{REF}$ going through reference memory cell 613 in order to determine the value of information stored in memory cell 603. FIG. 6 shows an example arrangement of memory elements (e.g., 630, 631, and 632) and associated access transistors (N7 and N8) of memory cells 603 and 613. The memory elements and associated access transistors of memory cells 603 and 613 may have other arrangements. For example, memory element 630 may be located between transistors N5 and N7 and memory elements 631 and 632 can be located between transistors N6 and N8.

Memory device 610 can include STT-RAM memory device. Labels "P" and "AP" in reference memory cell 613 indicate the parallel magnetic orientations and anti-parallel magnetic orientations, respectively, of corresponding memory elements 631 and 632 in reference memory cell 613.

Memory device 610 can include an access line (e.g., word lines) 604 to receive a signal (e.g., word line signal) WL to access memory cell 603. Memory device 610 can include transistors (e.g., p-channel transistors) P1 through and P5 and transistors (e.g., n-channel transistors) N1 through N4 that may form part of a sense amplifier (SA) circuitry (e.g., sense amplifier 340 of FIG. 3). Transistors (e.g., n-channel transistors) N5 and N6 may form part of a select circuit (e.g., select circuit 315 of FIG. 3).

Reference memory cell 613 can be located on a circuit path (e.g., current path) 671 between a node 681 and node 640. Memory cell 603 can be located on a circuit path (e.g., current path) 672 between a node 682 and node 640.

Memory device 610 can include a read voltage control circuit 670 that can operate to control the values of voltages V1 and V2 at nodes 681 and 682, respectively. The value of voltage V1 can remain unchanged during a read operation. Voltage V2 can have a different value at different times during a read operation. Voltages V1 and V2 can be generated from supply voltages of memory device 610.

Memory device 610 can include a read circuit 680 that can include circuit components such as buffers and latches. Read circuit 680 can be part of an I/O circuit (e.g., I/O circuit 316 of FIG. 1) of memory device 610. During a read operation, read circuit 680 can operate to determine a state (e.g., state X, state 0, or state 1) of the memory cell 603 based on the value of the signal at a node 691 during a sense stage of the read operation. The value of the signal at node 691 can be based on the values of currents $I_{REF}$ and $I_{CELL}$. The value of current $I_{REF}$ can depend on the state of reference memory cell 613. The value of current $I_{CELL}$ can depend on the state of memory cell 603. FIG. 6 shows an example where current $I_{REF}$ is based on a current across a reference memory cell (e.g., 613) having the "P" and "AP" magnetic orientations. The reference memory cell (e.g., 613) may have other magnetic orientations (e.g., other combinations of "P" and "AP" magnetic orientations). In an alternative arrangement, current $I_{REF}$ can be based on a reference memory cell that may not have the "P" and "AP" magnetic orientations. In another alternative arrangement, current $I_{REF}$ can be generated based on current mirror techniques, such that current $I_{REF}$ on circuit path 671 may be based on (e.g., proportional to) current $I_{CELL}$ on circuit path 672.

Figure 7A:
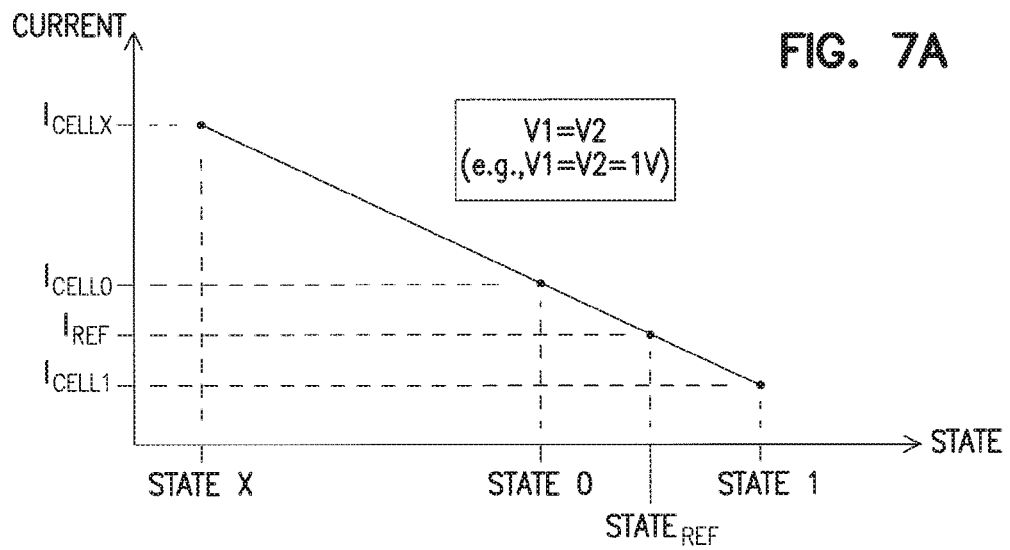
FIG. 7A shows the relationship between currents and states of a memory cell and a reference memory cell of FIG. 6 when voltages applied to current paths coupled to the memory cell and the reference memory cell have the same value, according to some embodiments described herein.

FIG. 7A shows the relationship between currents ($I_{CELLX}$, $I_{REF}$, $I_{CELL0}$, and $I_{CELL1}$) and states (state X, state ref, state 0, and state 1) of memory cell 603 and reference memory cell 613 when the values of voltages V1 and V2 are the same (e.g., 1V), according to some embodiments described herein. Currents $I_{CELL1}$, $I_{CELL0}$, and $I_{CELLX}$ represent current $I_{CELL}$ (in FIG. 6) when the states of memory cell 603 are state 1, state 0, and state X, respectively. Current $I_{REF}$ in FIG. 7A represents the current across memory cell 613 and can be relatively constant because resistance $R_{REF}$ of reference memory cell 613 can be set (e.g., programmed) at a fixed value.

During a sense stage of a read operation (e.g., an initial read), if the value of the signal at node 691 (FIG. 6) indicates $I_{REF} > I_{CELL}$ (the value of current $I_{REF}$ is greater than the value of current $I_{CELL}$), then $I_{CELL}$ corresponds to $I_{CELL1}$ (based on FIG. 7A). In this case, read circuit 680 may determine that memory cell 603 has state 1 (based on FIG. 7A). If the value of the signal at node 691 indicates $I_{REF} < I_{CELL}$ (the value of current $I_{REF}$ is less than the value of current $I_{CELL}$), then $I_{CELL}$ can be either $I_{CELLX}$ or $I_{CELL0}$ (based on FIG. 7A). In this case, an additional access to memory cell 603 (e.g., in an additional read after the initial read) is performed with a different value of voltage V2. The additional access determines whether memory cell 603 has state X or state 0.

Figure 7B:
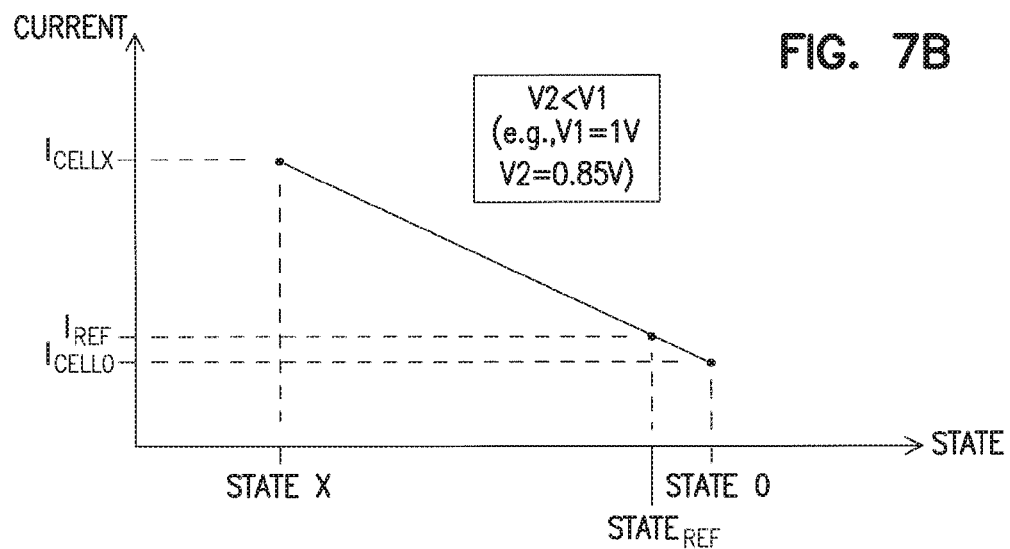
FIG. 7B shows the relationship between currents and states of a memory cell and a reference memory cell of FIG. 6 when voltages applied to current paths coupled to the memory cell and the reference memory cell have different values, according to some embodiments described herein.

FIG. 7B shows the relationship among $I_{CELLX}$, $I_{REF}$, and $I_{CELL0}$ when voltages V1 and V2 have different values, according to some embodiments described herein. For example, voltage V1 in FIG. 6 may remain at the same value (e.g., at 1V) and voltage V2 may change (e.g., from 1V to 0.85V), such that V2<V1 (the value of voltage V2 is less than the value of voltage V1). As shown in FIG. 7B, a lower value of voltage V2 during a read operation may cause the value of current across memory cell 603 to shift, such that the value of current $I_{REF}$ can be between the values of currents $I_{CELLX}$ and $I_{CELL0}$. This enables the state of memory cell 603 to be determined during a sense stage of an additional access (e.g., in an additional read) to memory cell 603.

Values of 0.85V and 1V n FIG. 7B are used as example values for voltages V2 and V1, respectively. Different values may be used as long as the values of currents $I_{CELL0}$ and $I_{CELLX}$ can be changed (e.g., shifted), such that the value of current $I_{REF}$ can be between the values of currents $I_{CELL0}$ and $I_{CELLX}$ (e.g., $I_{CELLX} < I_{REF} < I_{CELL0}$). For example, if the value of current $I_{REF}$ is approximately 32 uA (microamps) when V1=V2, then the value of V2 can be changed to a value such that V2<V1, so that the values of currents $I_{CELLX}$ and $I_{CELL}$ can be approximately, 30 uA and 35 uA. This causes the value (32 uA) of current $I_{REF}$ be to between 30 uA and 35 uA.

Based on FIG. 7B, during a sense stage of a read operation (e.g., additional read after the initial read where V1=V2), if the value of the signal at node 691 (FIG. 6) indicates $I_{REF} > I_{CELL}$, then $I_{CELL}$ corresponds to $I_{CELL0}$. In this case, read circuit 680 may determine that memory cell 603 has state 0. If the value of the signal at node 691 indicates $I_{REF} < I_{CELL}$, then $I_{CELL}$ corresponds to $I_{CELLX}$. In this case, read circuit 680 may determine that memory cell 603 has state X. Read circuit 680 may generate flag information (e.g., location of memory cell 603, or bit position associated with memory cell 603) if memory cell has state X. The flag information allows assignment of "0" and "1" to the bit associated with (e.g., stored in) memory cell 603. Then, a decode operation (as described above with reference to FIG. 5A and FIG. 5B) can be performed to provide the correct value (e.g., binary 0 or binary 1) of the bit stored in memory cell 603.

Thus, based on the currents and states relationships of memory cell 603 and reference memory cell 613 shown in FIG. 7A and FIG. 7B, the state of memory cell 603 can be determined in either one read (e.g., an initial read) or multiple reads (both initial and additional reads), depending on the state of memory cell 603.

Figure 8:
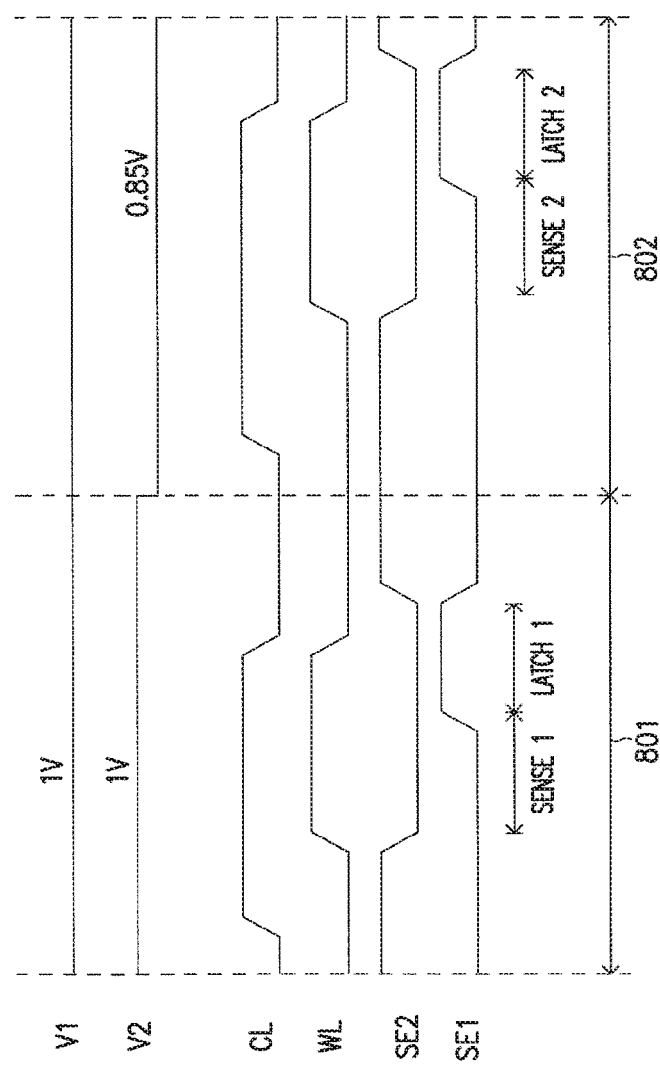
FIG. 8 is a timing diagram for some signals of the memory device of FIG. 6 during an operation of retrieving information from a memory cell, according to some embodiments described herein.

FIG. 8 is a timing diagram for some signals of memory device 610 of FIG. 6 during an operation of retrieving information from memory cell 603, according to some embodiments described herein. FIG. 8 shows timing of signals CL, WL, SE1, and SE2 in an access to memory cell 603 during time interval 801 and in an additional access to memory cell 603 during time interval 802. Depending on the state (e.g., state X, state 0, or state 1) of memory cell 603, one access (e.g., only the access during time interval 801) or multiple accesses (e.g., both accesses during time intervals 801 and 802) to memory cell 603 are performed in order to determine the state of memory cell 603 (thereby determining the value of information stored in memory cell 603).

During time interval 801 (e.g., initial access to memory cell 603), the state of memory cell 603 may or may not be determined, depending on the values of $I_{REF}$ and $I_{CELL}$, as described above with reference to FIG. 7A. For example, during time interval 801, if $I_{REF} > I_{CELL}$, then the state of memory cell 603 can be determined to be state 1 (based on FIG. 7A). In this case, accessing memory cell 603 during time interval 802 may be skipped (e.g., not be performed). In another example, if $I_{REF} < I_{CELL}$ during time interval 801, then the state of memory cell 603 may not be determined, because the state of memory cell 603 can be either state X or state 0. In this example, memory cell 603 can be accessed again during time interval 802. The state of memory cell 603 during time interval 802 can be determined based on the value of $I_{REF}$ and $I_{CELL}$, as described above with reference to FIG. 7B.

As shown in FIG. 8, voltage V1 can remain at the same value (e.g., 1V) during time intervals 801 and 802. Voltage V2 can change from one value (e.g., 1V) to another value (e.g., 0.85V). Memory device 610 can have two different nodes to receive two different voltages (e.g., internal supply voltages 0.85V and 1V). Read voltage control circuit 670 (FIG. 6) can be configured to cause the values of voltages V1 and V2 to have different values as shown in FIG. 8.

During each of time intervals 801 and 802, signals CL and WL and can be activated and deactivated at different signal levels as shown in FIG. 8 in order to access memory cell 603. Signals SE1 and SE2 can also be activated and deactivated at different signal levels as shown in FIG. 8 as part of a sense operation (e.g., sense stage (SENSE 1 or SENSE 2) and latch stage (LATCH 1 or LATCH 2)). During the latch portion in FIG. 8, read circuit 680 may store (e.g., latch) the value of information retrieved from memory cell 603.

For example, during time interval 801 (e.g., during LATCH 1), read circuit 680 may store a binary 1 if the signal at node 691 indicates that memory cell 603 has state 1. During time interval 801 (e.g., during LATCH 1), read circuit 680 may not store a value if the signal at node 691 indicates that memory cell 603 has either state X or state 0.

During time interval 802 (e.g., during LATCH 2), read circuit 680 may store a binary 0 if the signal at node 691 indicates that memory cell 603 has state 0. During time interval 802 (e.g., during LATCH 2), if the signal at node 691 indicates that memory cell 603 has state X, read circuit 680 may generate flag information that may be used for assignment of "0" and "1" to the bit associated with memory cell 603 during a decode operation (as described above with reference to FIG. 5A and FIG. 5B).

Figure 9:
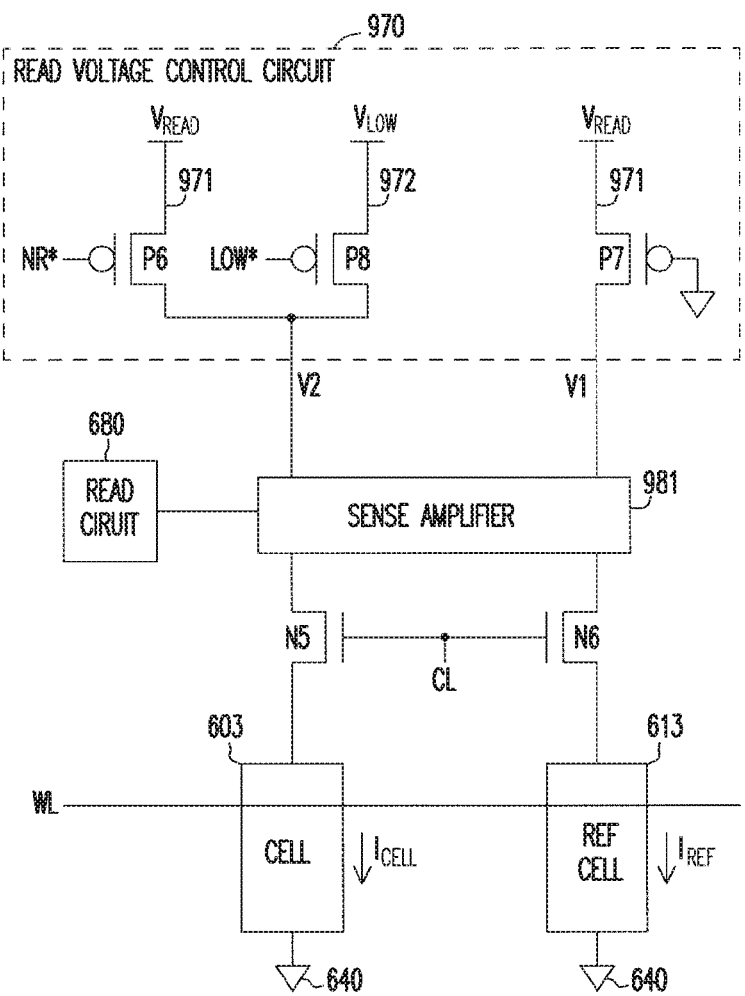
FIG. 9 shows a block diagram of a portion of a memory device including a read voltage control circuit, according to some embodiments described herein.

FIG. 9 shows a block diagram of a portion of a memory device 910 including a read voltage control circuit 970, according to some embodiments described herein. Memory device 910 can include circuit elements that are similar to or identical to those of memory device 610 of FIG. 6. For simplicity, similar or identical elements between FIG. 6 and FIG. 9 are given the same designation labels.

As shown in FIG. 9, memory device 910 can include read voltage control circuit 970, read circuit 680, sense amplifier 981, transistors N5 and N6, memory cell 603, and reference memory cell 613. Sense amplifier 981 can include elements similar to or identical to those of memory device 610 of FIG. 6, such as transistors N1 through N4, and P1 through P5.

Read circuit 680, as described above, can operate to determine the state of memory cell 603 during a read operation.

Memory device 910 may also include a write circuit (not shown in FIG. 9) that operates (e.g., controls voltages applied to the data line (e.g., bit line) and source line associated with memory cell 603) to store information in memory cell 603. For example, depending on the value (e.g., "0" or "1") of information to be stored in memory cell 603, the write circuit may cause a write current having a value, such that the state of memory cell 603 can be changed to between state 0 and state 1 if memory cell 603 is a normal memory cell (e.g., has not been determined to be defective). If memory cell 603 has been determined to be defective and its state has been changed to state X, then memory cell 603 may remain at state X even after the write current is applied.

As described above, a special write operation (e.g., during a "burn" process) as mentioned above with reference to FIG. 2 and FIG. 4F) may be performed to change the state (e.g., state 0 or state 1) of a particular memory cell to an irreversible state (e.g., state X) based on control information (e.g., CTL_INFO) indicating that the particular memory cell is determined to be defective. In FIG. 9, if memory cell 603 is determined to be defective, during such a special write operation, the write circuit (as mentioned above and not shown in FIG. 9) of memory device 910 may cause a relatively larger amount of current (relative to the amount of current in a normal write operation to store information in memory cell 603) to be applied to memory cell 603. Such a large amount of current flowing through memory cell 603 may change (e.g., permanently change) the structure of a memory element of memory cell 603 in order to place memory cell 603 in state X.

Read voltage control circuit 970 can operate to cause the values of voltages V1 and V2 to have different values. Read voltage control circuit 970 can include transistors (e.g., p-channel transistors) P6, P7, and P8, and nodes 971 and 972 to receive voltages $V_{READ}$ and $V_{LOW}$, respectively. The gates of transistors P6 and P8 can receive signals NR* and LOW*, respectively. The gate of transistor P7 can receive a signal (e.g., ground) so that transistor P7 may be turned on when memory cell 603 is accessed. Voltages $V_{LOW}$ and $V_{READ}$ can be generated from different supply voltages of memory device 910. The value of voltage $V_{READ}$ can be greater than the value of voltage $V_{LOW}$. For example, voltage $V_{READ}$ can have a value of 1V, and voltage V1 can have a value of 0.85V.

Figure 10:
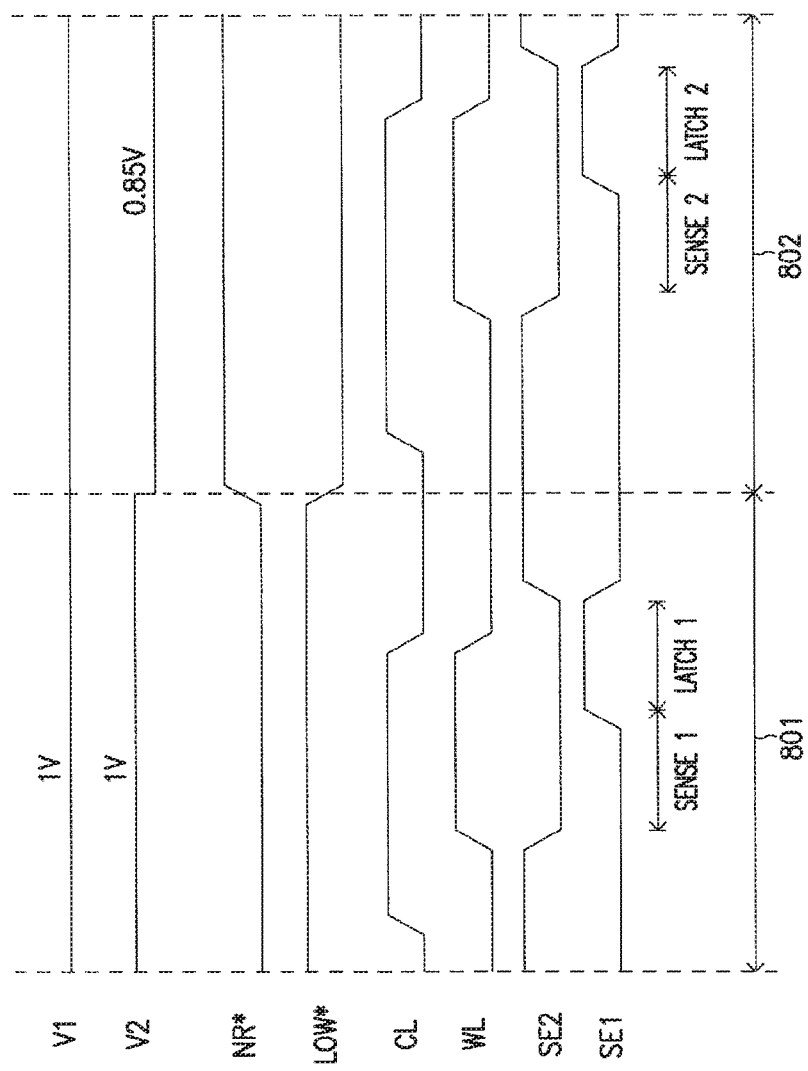
FIG. 10 is a timing diagram for some signals of the memory device of FIG. 6 during an operation of retrieving information from a memory cell, according to some embodiments described herein.

FIG. 10 is a timing diagram for some signals of memory device 910 of FIG. 6 during an operation of retrieving information from memory cell 603, according to some embodiments described herein. Voltages V1 and V2, signals CL, WL, SE1, and SE2, sense stages (e.g., SENSE 1 and SENSE 2), and latch stages (e.g., LATCH 1 and LATCH 2) in FIG. 10 can be similar to or identical to those of FIG. 8.

During time interval 801 in FIG. 10, signal NR* can be provided with a level (e.g., low) and signal LOW* can be provided with a level (e.g., high), such that transistor P6 can be turned on, and transistor P8 can be turned off. Transistor P7 can be turned on during both time intervals 801 and 802. During time interval 801, the value of voltage V1 is based on the value of voltage $V_{READ}$ (e.g., 1V). The value of voltage V2 is also based on the value of voltage $V_{READ}$ (e.g., 1V).

During time interval 802 signal NR* can be provided with another level (e.g., high) and signal LOW* can be provided with another level e.g., low), such that transistor P7 can be turned off, and transistor P8 can be turned on. As mentioned above, transistor P7 can be turned on during time interval 802. During time interval 802, the value of voltage V1 is based on the value of voltage $V_{LOW}$ (e.g., 0.85V). The value of voltage V2 is based on the value of voltage $V_{READ}$ (e.g., 1V). As described above with reference to FIG. 6, FIG. 7A, FIG. 7B, and FIG. 8, applying different voltages (e.g., V1 and V2) may allow the state (e.g., state X, state 0, or state 1) of memory cell 603 to be determined.

Figure 11:
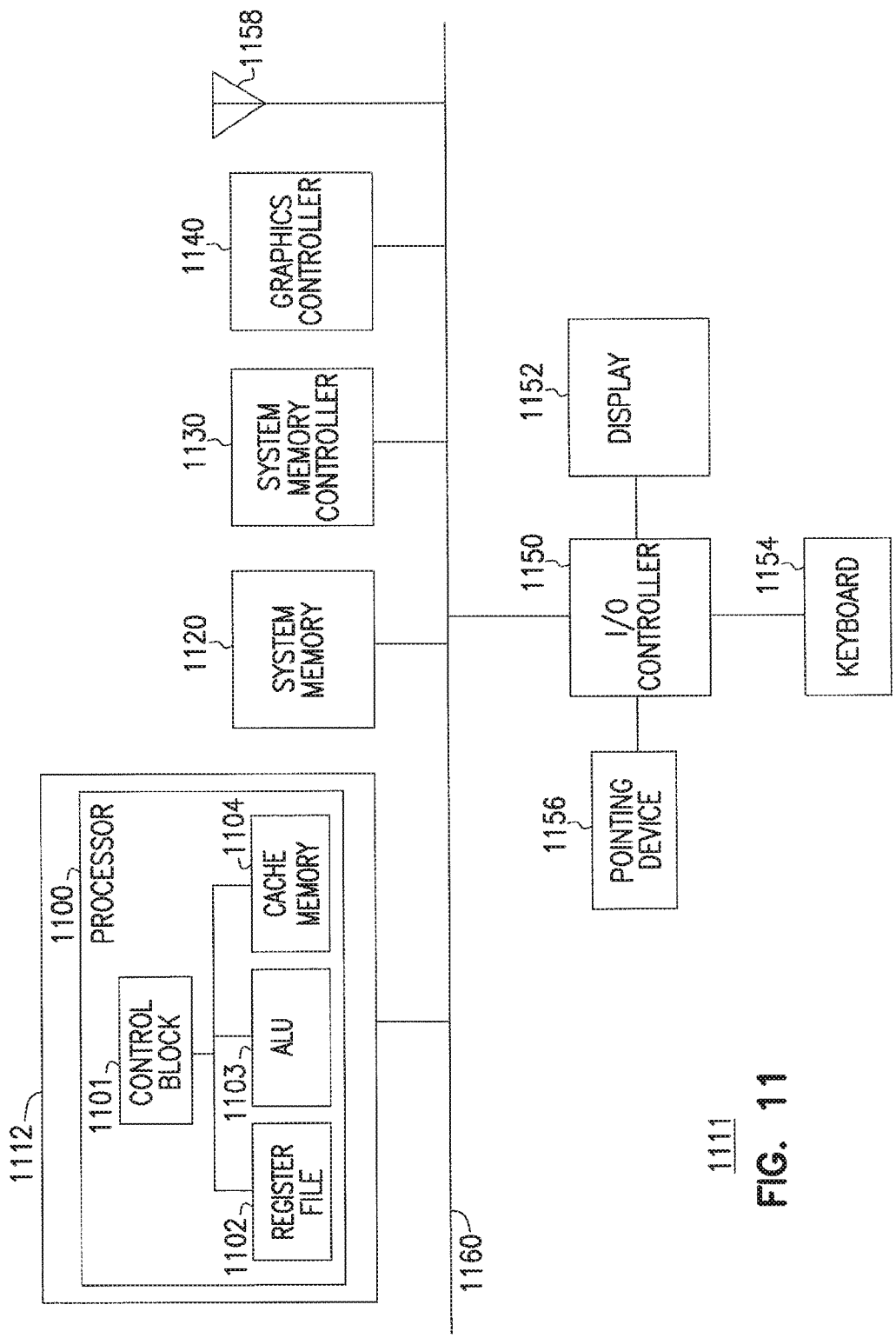
FIG. 11 shows a block diagram of an apparatus in the form of a system (e.g., electronic system), according to some embodiments described herein.

FIG. 11 shows an apparatus in the form of a system (e.g., electronic system) 1111, according to some embodiments described herein. System 1111 can include or be included in a computer (e.g., desktop or notebook computer), a tablet, a cellular telephone, and other electronic devices or systems. As shown in FIG. 11, system 1111 can include a processor 1100, a system memory 1120, a system memory controller 1130, a graphics controller 1140, an input and output (I/O) controller 1150, a display 1152, a keyboard 1154, a pointing device 1156, at least one antenna 1158, and a bus 1160.

Processor 1100 may be a general-purpose processor or an application specific integrated circuit (ASIC). Processor 1100 can correspond to processor 100 of FIG. 1. Processor 1100 can include a control block 1101, a register file 1102, an ALU 1103, and cache memory 1104. Control block 1101 can include control block 101 of FIG. 1. Register file 1102 can include register file 102 of FIG. 1. Cache memory 1104 can include cache memory 104 of FIG. 1 or cache memory 204 of FIG. 2 and operations (e.g., write, read, and decode operations) described above with reference to FIG. 1 through FIG. 10.

System memory 1120 can include a DRAM device, an SRAM device, a flash memory device, or a combination of these memory devices. I/O controller 1150 can include a communication module for wired or wireless communication (e.g., communication through one or more antennas 1158). Display 1152 can include a liquid crystal display (LCD), a touchscreen (e.g., capacitive or resistive touchscreen), or another type of display. Pointing device 1156 can include a mouse, a stylus, or another type of pointing device.

As shown in FIG. 11, processor 1100 can be located on (e.g., formed on or formed in) a die (e.g., semiconductor die) 1112. Thus, control block 1101, register file 1102, ALU 1103, and cache memory 1104 can be located on the same die (such as die 1112). In an alternative arrangement, cache memory 1104 can be located outside processor 1100 (e.g., outside die 1112).

FIG. 11 shows the components of system 1111 arranged separately from each other as an example. In some arrangements, two or more components of system 1111 can be located on the same die (e.g., same chip) that forms a system-on-chip (SoC).

FIG. 12 is a flow diagram showing a method 1200 of monitoring errors in information retrieved from memory cells, according to some embodiments described herein. Method 1200 can be performed by a memory, such as cache memory described above with reference to FIG. 1 through FIG. 10. At least a portion of method 1200 may be implemented by software, firmware, hardware or any combination of software, firmware, and hardware.

As shown in FIG. 12, method 1200 can include activity 1210, 1220, 1230, and 1240. Activity 1210 can include monitoring errors in information retrieved from memory cells of a memory device (e.g., memory device 110, 210, or 310). Activity 1220 can include determining whether a condition for determining a memory cell to be defective is met. For example, activity 1220 can include determining whether a number of errors in a bit of information in a memory cell in consecutive read operations reaches a limit.

If the condition in activity 1220 is not met (indicated by "NO" in FIG. 12), method 1200 may continue with activity 1230. Activity 1230 can include updating (if any) error tracking information based on the monitor in activity 1210. The error tracking information can include a record (e.g., history) of a particular memory cell (or memory cells) where the bits of information retrieved from such particular memory cell have errors. Updating in activity 1230 may include updating information stored in a pointer (e.g., MRE pointer 251 in FIG. 2), a counter (e.g., counter 252 in FIG. 2), or in both the pointer and counter. Method 1200 may repeat activity 1210 to continue monitoring errors in information retrieved from the memory cells.

If the condition in activity 1220 is met (indicated by "YES" in FIG. 12), method 1200 may continue with activity 1240. Activity 1240 can include changing the state of the memory cell that meets the condition from one state (e.g., state 0 or state 1) to another state (e.g., irreversible state X).

Method 1200 can include additional activities (e.g., operations) of a cache memory described above with reference to FIG. 1 through FIG. 11.

Figure 13:
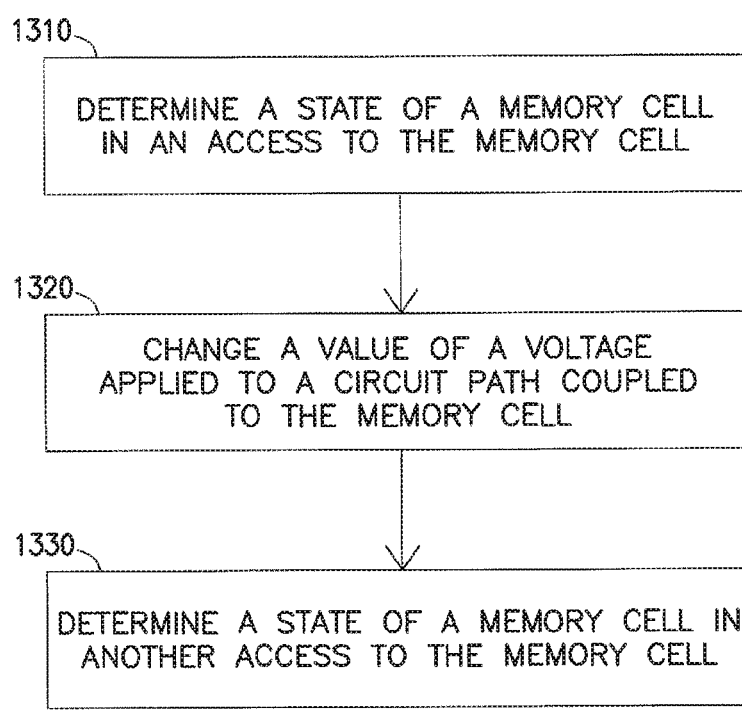
FIG. 13 is a flow diagram showing a method of determining a state of a memory cell, according to some embodiments described herein.

FIG. 13 is a flow diagram showing a method 1300 of determining a state of a memory cell, according to some embodiments described herein. Method 1300 can be performed by a memory (e.g., by memory device 110, 210, 310, 610, or 910) described above with reference to FIG. 1 through FIG. 10. At least a portion of method 1300 may be implemented by software, firmware, hardware or any combination of software, firmware, and hardware.

As shown in FIG. 13, method 1300 can include activity 1310 and 1320. Method 1300 shows activities to determine a state of one memory cell of a memory device for simplicity. The state of each memory cell of the memory device can be determined by similar or identical activities of method 1300.

Activity 1310 can include determining a state of a memory cell in an access to the memory cell during a read operation. The memory cell may have a state such as state X, state 0, or state 1.

Activity 1320 can include changing a value of a voltage applied to a circuit path (e.g., circuit path 672) coupled to the memory cell if the state of the memory cell is unable to be determined in activity 1310.

Activity 1330 can include determining a state of the memory cell in another access after changing the value of the voltage in activity 1320.

Method 1300 may skip (e.g., may not perform) activities 1320 and 1330 if activity 1310 can successfully determine the state of the memory cell. For example, in activity 1310, if the memory cell has state 1, then activity 1310 may be able to determine the state of the memory cell (e.g., if $I_{REF} > I_{CELL}$, as described above). In this example, method 1300 may skip activities 1320 and 1330.

In another example, in activity 1310, if the memory cell has state X or state 0, then activity 1310 may be unable to indicate the state of the memory cell (e.g., if $I_{REF} < I_{CELL}$, as described above). In this example, method 1300 can perform activities 1320 and 1330 in order to determine whether the memory cell has state X or state 0.

Method 1300 can include additional activities (e.g., operations of memory device 110, 210, 310, 610, or 910) described above with reference to FIG. 1 through FIG. 11.

Figure 14:
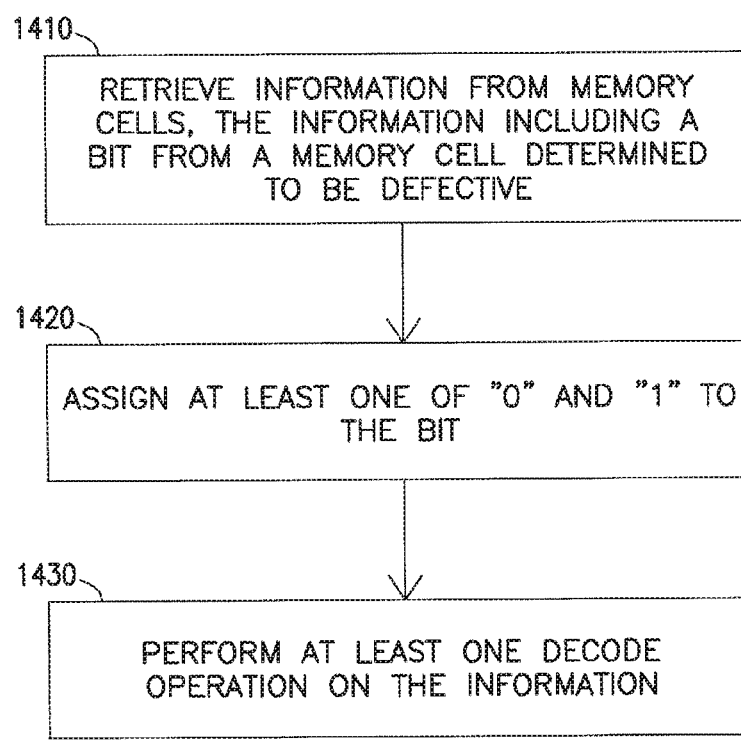
FIG. 14 is a flow diagram showing a method of decoding information retrieved from memory cells, according to some embodiments described herein.

FIG. 14 is a flow diagram showing a method 1400 of decoding information retrieved from memory cells, according to some embodiments described herein. Method 1400 can be performed by a cache memory, such as the cache memory described above with reference to FIG. 1 through FIG. 10. At least a portion of method 1400 may be implemented by software, firmware, hardware or any combination of software, firmware, and hardware.

As shown in FIG. 14, method 1400 can include activity 1410, 1420, and 1430. Activity 1410 can include retrieving information from memory cells. The information may include a bit from a memory cell determined to be defective.

Activity 1420 can include assigning at least one of "0" and "1" to the bit.

Activity 1430 can include performing at least one decode operation on the information. For example, activity 1430 may perform at least one of decode operation 571, 572, or both (FIG. 5A and FIG. 5B). Method 1400 may provide data (e.g., $D_{OUT}$) based on the result (or results) of the decode operation (or decode operations) performed in activity 1430.

Method 1400 can include additional activities (e.g., operations) of a cache memory described above with reference to FIG. 1 through FIG. 11.

The embodiments described may be implemented in one or a combination of hardware, firmware and software. Embodiments may also be implemented as instructions stored on a computer-readable storage medium, which may be read and executed by at least one processor to perform the operations and activities described herein. A computer-readable storage medium may include any non-transitory mechanism for storing information instructions) in a form readable by a machine (e.g., a computer). For example, a computer-readable storage medium may include read-only memory (ROM), random-access memory (RAM), magnetic disk storage media, optical storage media, flash-memory devices, and other storage devices and media. In these embodiments, one or more processors (e.g., processor 1100) may be configured with the instructions to perform the operations and activities described herein.

The illustrations of apparatus (e.g., processor 100, cache memory 204, memory devices 210, 310, 610, and 910, and system 1111) and methods (e.g., methods 1200, 1300, 1400 and the operations of processor 100, cache memory 204, memory devices 210, 310, 610, and 910, and system 1111) described above with reference to FIG. 1 through FIG. 14) are intended to provide a general understanding of the structure of various embodiments and are not intended to provide a complete description of all the elements and features of apparatuses that might make use of the structures described herein.

The apparatus (e.g., processor 100, cache memory 204, memory devices 210, 310, 610, and 910, and system 1111) described herein may include or be included in electronic circuitry, such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 5) players), vehicles, medical devices (e.g., heart monitor, blood pressure monitor, etc.), set top boxes, and others.

ADDITIONAL NOTES AND EXAMPLES

Example 1 includes subject matter (such as a device, an electronic apparatus (e.g., circuit, electronic system, or both), or machine) including an interface to receive information from memory cells, the memory cells configured to have a plurality of states to indicate values of information stored in the memory cells, and a control unit to monitor errors in information retrieved from the memory cells and generate control information based on the errors in the information to cause a memory cell among the memory cells to change to from a state among the plurality of states to an additional state, the additional state being different from the plurality of states.

In Example 2, the subject matter of Example 1 may optionally include, wherein the additional state is an irreversible state, the irreversible state is an identifiable state when the memory cell is accessed.

In Example 3, the subject matter of Example 1 may optionally include, wherein the additional state is not configured to indicate a value of information stored in the memory cell.

In Example 4, the subject matter of Example 1 may optionally include, wherein the control unit is configured to provide additional information to be stored in the memory cell after the memory cell changes from the state among the plurality of states to the additional state, and the memory cell remains in the additional state after the additional information is stored in the memory cell.

In Example 5, the subject matter of any of Examples 1 to 4 may optionally include, wherein the control unit is configured to perform an error detection and correction operation to determine a value of information retrieved from the memory cell.

In Example 6, the subject matter of any of Examples 1 to 4 may optionally include, wherein the memory cell includes a memory element, the memory element has a first resistance when the memory cell is in the first state, a second resistance when the memory cell is in the second state, and a third resistance when the memory cell is in the additional state, and the third resistance has value less than a value of each of the first and second resistances.

In Example 7, the subject matter of any of Examples 1 to 4 may optionally include, wherein the control unit is configured to generate the control information if a number of occurrences of errors in information retrieved from the memory cell exceeds a value before the memory cell changes from the state among the plurality of states to the additional state.

In Example 8, the subject matter of any of Examples 1 to 4 may optionally include, wherein the control unit is configured to generate the control information if errors in the information retrieved from the memory cell occur in a number of read operations before the memory cell changes from the state among the plurality of states to the additional state.

In Example 9, the subject matter of any of Examples 1 to 4 may optionally include, wherein the control unit is configured to adjust a scrub rate associated with the memory cells after the memory cell changes from the state among the plurality of states to the additional state.

In Example 10, the subject matter of any of Examples 1 to 4 may optionally include, wherein the memory cell and the control unit are included in a cache memory, and the cache memory does not have spare memory cells.

Example 11 includes subject matter (such as a device, an electronic apparatus (e.g., circuit, electronic system, or both), or machine) including an interface to receive information from memory cells, the memory cells comprising a memory cell determined to be defective, the information including a bit stored in the memory cell, and a control unit to assign at least one value to the bit, to perform at least one error detection and correction operation on the information and to provide data based on the at least one error detection and correction operation.

In Example 12, the subject matter of Example 11 may optionally include, wherein the control unit is configured to assign a first value to the bit and perform a first error detection and correction operation, assign a second value to the bit if the first error detection and correction operation unsuccessfully provides the data, and perform a second error detection and correction operation on the information after assigning the second value to the bit, and provide the data based on one of the first and second error detection and correction operations.

In Example 13, the subject matter of Example 12 may optionally include, wherein the first value comprises binary 0 and the second value comprises binary 1.

In Example 14, the subject matter of Example 12 may optionally include, wherein the first value comprises binary 1 and the second value comprises binary 0.

In Example 15, the subject matter of Example 11 may optionally include, wherein the control unit is configured to assign a first value to the bit, and perform a first error detection and correction operation on the information, assign a second value to the bit, and perform a second error detection and correction operation on the information, and provide the data based on one of the first and second error detection and correction operations.

In Example 16, the subject matter of any of Examples 11 to 15 may optionally include, wherein the control unit is configured to generate error correction code based on input data to provide information to be stored in the memory cells and in the memory cell determined to be defective.

In Example 17, the subject matter of Examples 11 to 15 may optionally include, wherein the control unit is included in a cache memory controller.

In Example 18, the subject matter of any of Examples 11 to 15 may optionally include, wherein the memory cells comprise spin-torque transfer random access memory (STT-RAM) memory cells.

Example 19 includes subject matter (such as a device, an electronic apparatus (e.g., circuit, electronic system, or both), or machine) including a first memory cell configured to store information, the first memory cell including a first memory element configured to be changed between a first state and a second state, the first state indicating a first value of information stored in the first memory cell, the second state indicating a second value of information stored in the first memory cell, and a second memory cell configured to store information, the second memory cell including a second memory element having one of the first state, the second state, and a third state, the third state unable to be changed to either the first state or the second state.

In Example 20, the subject matter of Example 19 may optionally include, wherein the first memory element has a first resistance in the first state and a second resistance in the second state.

In Example 21, the subject matter of Example 20 may optionally include, wherein the second memory element has a third resistance in the third state, and a value of the third resistance is less than a value of each of the first and second resistances.

In Example 22, the subject matter of any of Examples 19 to 21 may optionally include, wherein the second memory cell is coupled to a circuit path between a node and ground, and the node is configured to receive a first voltage during a first access to the second memory cell and a second voltage during a second access to the second memory cell, and a value of information stored in the second memory cell is based on a value of a signal on the circuit path during at least one of the first and second accesses.

Example 23 includes subject matter (such as a device, an electronic apparatus (e.g., circuit, electronic system, or both), or machine) including a processing core, and a cache memory coupled to the processing core, the cache memory comprising memory cells, and a cache controller to monitor errors in information retrieved from the memory cells and generate control information based on the errors in the information to cause an irreversible change in a state of a memory cell among the memory cells.

In Example 24, the subject matter of Example 23 may optionally include, wherein cache controller is configured to generate error correction code based on input data provided to the cache memory and to store the input data and the error correction code in the memory cells, such that at least a portion of the information is stored in the memory cell.

In Example 25, the subject matter of Example 24 may optionally include, wherein e cache controller is configured to decode information retrieved from the memory cells to provide output data such that the output data and the input data have a same value.

Example 26 includes subject matter (such as a method of operating a device, an electronic apparatus (e.g., circuit, electronic system, or both), or machine) including monitoring errors in information retrieved from memory cells of memory device, based on the monitoring of the errors in information, determining whether a condition for determining a memory cell to be defective is met, updating error tracking information based on the monitoring if the condition is not met, and changing a state of the memory cell if the condition is met.

In Example 27, the subject matter of Example 26 may optionally include, wherein monitoring the errors in the information includes determining whether a number of errors in a bit of information in one of the memory cells reaches a limit.

In Example 28, the subject matter of Example 26 may optionally include, wherein changing the state of the memory cell includes changing the state from one of states used to indicate values of information stored in the memory cells to an additional state different from the states used to indicate the values of information stored in the memory cells.

In Example 29, the subject matter of Example 28 may optionally include, wherein the additional state includes an irreversible state.

In Example 30, the subject matter of Example 28 or 29 may optionally include, storing information in the memory cell after the state of the memory cell is changed.

In Example 31, the subject matter of Example 28 may optionally include, wherein the states used to indicate values of information stored in the memory cells correspond to different resistances, the additional state corresponds to an additional resistance, and the additional resistance has a value less than a value of each of the difference resistances.

In Example 32, the subject matter of Example 31 may optionally include, performing an error detection and correction operation to determine a value of information retrieved from the memory cell.

Example 33 includes subject matter (such as a method of operating a device, an electronic apparatus (e.g., circuit, electronic system, or both), or machine) including determining a state of a memory cell in an access to the memory cell during a read operation, changing a value of a voltage applied to a circuit path coupled to the memory cell if the state of the memory cell is unable to be determined after the access, and determining the state of the memory cell in an additional access to the memory cell after changing the value of the voltage.

In Example 34, the subject matter of Example 33 may optionally include, wherein changing a value of the voltage includes reducing the value of the voltage.

In Example 35, the subject matter of Example 33 may optionally include, wherein determining the state of the memory cell in the access to the memory cell includes comparing a current flowing through the memory cell with a current on an additional circuit path to provide a comparison result, and the state of the memory cell is based on the comparison result.

In Example 36, the subject matter of Example 35 may optionally include, wherein determining the state of the memory cell in the additional access to the memory cell includes comparing a current flowing through the memory cell after the voltage is changed with the current on the additional circuit path to provide an additional comparison result, and the state of the memory cell is based on a result of the additional comparison result.

In Example 37, the subject matter of Examples 33 or 34 may optionally include, wherein the current on the additional circuit path flows through a reference memory cell.

In Example 38, the subject matter of Examples 33 or 34 may optionally include, wherein a value of the current on the additional circuit path is proportional to a value of the current flowing through the memory cell.

Example 39 includes subject matter (such as a device, an electronic apparatus (e.g., circuit, electronic system, or both), or machine) including memory cells, and means to perform a method as recited in any of Examples 26 to 38.

Example 40 includes subject matter including a computer-readable storage medium that stores instructions for execution by one or more processors of an electronic apparatus to perform a method as recited in any of Examples 26 to 38.

The subject matter of Example 1 through Example 40 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   an interface to receive information from memory cells, the memory cells configured to have a plurality of states to indicate values of information stored in the memory cells; and
   a control unit to monitor errors in information retrieved from the memory cells and generate control information based on the errors in the information to cause a memory cell among the memory cells to change to from a state among the plurality of states to an irreversible state, the irreversible state being different from the plurality of states, wherein the control unit is configured to provide information to be stored in the memory cell during a write operation after the memory cell changes from the state among the plurality of states to the irreversible state, and the memory cell remains in the irreversible state after the write operation.

2. The apparatus of claim 1, wherein the irreversible state is an identifiable state when the memory cell is accessed.

3. The apparatus of claim 1, wherein the irreversible state is not configured to indicate a value of information stored in the memory cell.

4. The apparatus of claim 1, wherein the memory cell includes a memory element, the memory element has a first resistance when the memory cell is in the first state, a second resistance when the memory cell is in the second state, and a third resistance when the memory cell is in the irreversible state, and the third resistance has value less than a value of each of the first and second resistances.

5. The apparatus of claim 1, wherein the control unit is configured to generate the control information if a number of occurrences of errors in information retrieved from the memory cell exceeds a value before the memory cell changes from the state among the plurality of states to the irreversible state.

6. The apparatus of claim 1, wherein the control unit is configured to generate the control information if errors in the information retrieved from the memory cell occur in a number of read operations before the memory cell changes from the state among the plurality of states to the irreversible state.

7. The apparatus of claim 1, wherein the control unit is configured to adjust a scrub rate associated with the memory cells after the memory cell changes from the state among the plurality of states to the irreversible state.

8. The apparatus of claim 1, wherein the memory cell and the control unit are included in a cache memory, and the cache memory does not have spare memory cells.

9. An apparatus comprising:
an interface to receive information from memory cells, the memory cells configured to have a plurality of states to indicate values of information stored in the memory cells; and
a control unit to monitor errors in information retrieved from the memory cells and generate control information based on the errors in the information to cause a memory cell among the memory cells to change to from a state among the plurality of states to an irreversible state, the irreversible state being different from the plurality of states, wherein the control unit is configured to provide information to be stored in the memory cell after the memory cell changes from the state among the plurality of states to the irreversible state, and the memory cell remains in the irreversible state after the information is stored in the memory cell.

10. The apparatus of claim 9, wherein the control unit is configured to perform an error detection and correction operation to determine a value of information retrieved from the memory cell.

11. An apparatus comprising:
an interface to receive information from memory cells, the memory cells comprising a memory cell determined to be defective, the information including a bit stored in the memory cell; and
a control unit to assign at least one value to the bit, to perform at least one error detection and correction operation on the information and to provide data based on the at least one error detection and correction operation, wherein the control unit is configured to:
assign a first value to the bit and perform a first error detection and correction operation;
assign a second value to the bit if the first error detection and correction operation unsuccessfully provides the data, and perform a second error detection and correction operation on the information after assigning the second value to the bit; and
provide the data based on one of the first and second error detection and correction operations, wherein the first value comprises binary 0 and the second value comprises binary 1.

12. An apparatus comprising:
an interface to receive information from memory cells, the memory cells comprising a memory cell determined to be defective, the information including a bit stored in the memory cell; and
a control unit to assign at least one value to the bit, to perform at least one error detection and correction operation on the information and to provide data based on the at least one error detection and correction operation, wherein the control unit is configured to:
assign a first value to the bit and perform a first error detection and correction operation;
assign a second value to the bit if the first error detection and correction operation unsuccessfully provides the data, and perform a second error detection and correction operation on the information after assigning the second value to the bit; and
provide the data based on one of the first and second error detection and correction operations, wherein the first value comprises binary 1 and the second value comprises binary 0.

13. The apparatus of claim 11, wherein the control unit is configured to generate error correction code based on input data to provide information to be stored in the memory cells and in the memory cell determined to be defective.

14. The apparatus of claim 11, wherein the control unit is included in a cache memory controller.

15. The apparatus of claim 12, wherein the memory cells comprise spin-torque transfer random access memory (STT-RAM) memory cells.

16. An apparatus comprising:
a first memory cell configured to store information, the first memory cell including a first memory element configured to be changed between a first state and a second state, the first state indicating a first value of information stored in the first memory cell, the second state indicating a second value of information stored in the first memory cell;
a second memory cell configured to store information, the second memory cell including a second memory element having a third state, the third state unable to be changed to either the first state or the second state; and
a control unit configured to provide information to be stored in the first and second memory cell during a write operation while the second memory cell has the third state, and the second memory cell remains in the third state after the write operation.

17. The apparatus of claim 16, wherein the first memory element has a first resistance in the first state and a second resistance in the second state.

18. The apparatus of claim 17, wherein the second memory element has a third resistance in the third state, and a value of the third resistance is less than a value of each of the first and second resistances.

19. The apparatus of claim 16, wherein the second memory cell is coupled to a circuit path between a node and ground, and the node is configured to receive a first voltage during a first access to the second memory cell and a second voltage during a second access to the second memory cell, and a value of information stored in the second memory cell is based on a value of a signal on the circuit path during at least one of the first and second accesses.

20. An apparatus comprising:
a processing core; and
a cache memory coupled to the processing core, the cache memory comprising:
memory cells; and
a cache controller, the memory cells and the cache controller located on a same semiconductor die, the cache controller to monitor errors in information retrieved from the memory cells and generate control information based on the errors in the information to cause a memory cell among the memory cells to have an irreversible state, wherein the cache controller is configured to provide information to be stored in the memory cell during a write operation after the memory cell has the irreversible state, and the memory cell remains in the irreversible state after the write operation.

21. The apparatus of claim 20, wherein cache controller is configured to generate error correction code based on input data provided to the cache memory and to store the input data and the error correction code in the memory cells, such that at least a portion of the information is stored in the memory cell.

22. The apparatus of claim 21, wherein the cache controller is configured to decode information retrieved from the memory cells to provide output data such that the output data and the input data have a same value.

\* \* \* \* \*